United States Patent
Carman et al.

(10) Patent No.: US 8,400,811 B2
(45) Date of Patent: Mar. 19, 2013

(54) TECHNIQUES FOR PROVIDING A DIRECT INJECTION SEMICONDUCTOR MEMORY DEVICE HAVING GANGED CARRIER INJECTION LINES

(75) Inventors: Eric S. Carman, Cernex (FR); Michael A. Van Buskirk, Saratoga, CA (US); Yogesh Luthra, Chavannes-pres-Renens (CH)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 12/768,363

(22) Filed: Apr. 27, 2010

(65) Prior Publication Data

US 2010/0271858 A1    Oct. 28, 2010

Related U.S. Application Data

(60) Provisional application No. 61/173,014, filed on Apr. 27, 2009.

(51) Int. Cl.
*G11C 5/06* (2006.01)
*G11C 7/00* (2006.01)

(52) U.S. Cl. ................... 365/72; 365/189.011; 257/347; 257/378

(58) Field of Classification Search .................... 365/72, 365/189.011; 257/378, 347
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |

(Continued)

FOREIGN PATENT DOCUMENTS

| CA | 272437 | 7/1927 |
|---|---|---|
| EP | 0 030 856 | 6/1981 |

(Continued)

OTHER PUBLICATIONS

Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.

Arimoto et al., A Configurable Enhanced T2RAM Macro for System-Level Power Management Unified Memory, 2006, VLSI Symposium.

Arimoto, A High-Density Scalable Twin Transistor RAM (TTRAM) With Verify Control for SOI Platform Memory IPs, Nov. 2007, Solid-State Circuits.

(Continued)

*Primary Examiner* — Toan Le
*Assistant Examiner* — Hai Pham
(74) *Attorney, Agent, or Firm* — Wilmer Cutler Pickering Hale and Dorr LLP

(57) ABSTRACT

Techniques for providing a direct injection semiconductor memory device having ganged carrier injection lines are disclosed. In one particular exemplary embodiment, the techniques may be realized as an apparatus including a first region coupled to a bit line and a second region coupled to a source line. The apparatus may also comprise a body region spaced apart from and capacitively coupled to a word line, wherein the body region is electrically floating and disposed between the first region and the second region. The apparatus may further comprise a third region coupled to a constant voltage source via a carrier injection line configured to inject charges into the body region through the second region.

27 Claims, 13 Drawing Sheets

U.S. PATENT DOCUMENTS

| | | |
|---|---|---|
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,295,107 A | 3/1994 | Okazawa et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,659,504 A | 8/1997 | Bude et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,255,166 B1 | 7/2001 | Ogura et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,399,441 B1 | 6/2002 | Ogura et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,597,047 B2 | 7/2003 | Arai et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,804,149 B2 | 10/2004 | Ogura et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |

| | | |
|---|---|---|
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 7,974,127 B2 | 7/2011 | Chong et al. |
| 8,159,875 B2 | 4/2012 | Bhattacharyya |
| 8,199,595 B2 | 6/2012 | Bauser et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0042938 A1 | 3/2003 | Shvarts |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2004/0233715 A1 | 11/2004 | Umezawa |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0215477 A1 | 9/2006 | Yano et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0091655 A1 | 4/2007 | Oyama et al. |
| 2007/0097751 A1 | 5/2007 | Popoff et al. |
| 2007/0103975 A1 | 5/2007 | Li et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0021984 A1 | 1/2009 | Wang |
| 2009/0086535 A1 | 4/2009 | Ferrant et al. |
| 2009/0116286 A1 | 5/2009 | Chong et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0046290 A1 | 2/2010 | Park et al. |
| 2010/0085813 A1 | 4/2010 | Shino |
| 2010/0091586 A1 | 4/2010 | Carman |
| 2010/0110816 A1 | 5/2010 | Nautiyal et al. |
| 2011/0019481 A1 | 1/2011 | Luthra |
| 2011/0019482 A1* | 1/2011 | Van Buskirk et al. ... 365/185.18 |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |

| | | |
|---|---|---|
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Asian Technology Information Program (ATIP) Scoops™, "Novel Capacitorless 1T-DRAM From Single-Gate PS-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06. International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multifunctional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architecture of Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et at, Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. on El. Dev.
Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces Responsible for Junction Leakage on SOI May 2009, ICSI.
Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.
Lu et al., A Novel Two- Transistor Floating Body/Gate Cell for Low Power Nanoscale Embedded DRAM, 2008, IEEE Trans. on El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of 6F2 Single Cell Operation in Multi Gbit Memories Confirmed by a Newly Developed Method for Measuring Signal Sense Margin, 2007, IEDM.
Minami, A Floating Body Cell (FBC) fully Compatible with 90nrn CMOS Technology(CMOS IV) for 128Mb SOI DRAM, 2005, IEDM.
Mohapatra et al., Effect of Source/Drain Asymmetry on the Performance of Z-RAMO Devices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp.
Nemati, A Novel Thyristor-based SRAM Cell (T-RAM) for High-Speed, Low-Voltage, Giga-scale Memories, 1999, IEDM Conference.
Nemati, Embedded Volatile Memories-Embedded Tutorial: The New Memory Revolution, New Drives Circuits and Systems, ICCAD 2008, Nov. 2008.
Nemati, Fully Planar 0.562µm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM (T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.
Puget et al., Quantum effects influence on thin silicon film capacitor-less DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less Dram Memory, SOI Conference, 2009 IEEE International, Oct. 5-8, 2009 pp. 1-2.
Roy, Thyristor-Based Volatile Memory in Nano-Scale CMOS, 2006, ISSCC.
Salling et al., Reliability of Thyristor Based Memory Cells, 2009, IRPS.
Sasaki et al., Charge Pumping in SOS-MOS Transistors, 1981, IEEE Trans. on El. Dev.
Sasaki et al., Charge Pumping SOS-MOS Transistor Memory, 1978, IEDM.
Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. on El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm Box Structure for Embedded DRAM Applications, 2004, VLSI Symposium.
Sim et al., "Source-Bias Dependent Charge Accumulation in P+ -Poly Gate SOI Dynamic Random Access Memory Cell Transistors", Jpn. J. Appl. Phys. vol. 37 (1998) pp. 1260-1263, Part 1, No. 3B, Mar. 1998.
Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. on El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. on El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

* cited by examiner

TECHNIQUES FOR PROVIDING A DIRECT INJECTION SEMICONDUCTOR MEMORY DEVICE HAVING GANGED CARRIER INJECTION LINES

CROSS-REFERENCE TO RELATED APPLICATIONS

This patent application claims priority to U.S. Provisional Patent Application No. 61/173,014, filed Apr. 27, 2009, which is hereby incorporated by reference herein in its entirety.

FIELD OF THE DISCLOSURE

The present disclosure relates generally to semiconductor memory devices and, more particularly, to techniques for providing a direct injection semiconductor memory device having ganged carrier injection lines.

BACKGROUND OF THE DISCLOSURE

The semiconductor industry has experienced technological advances that have permitted increases in density and/or complexity of semiconductor memory devices. Also, the advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Semiconductor-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (for example, double or triple gate), and Fin-FET devices.

A semiconductor memory device may include a memory cell having a memory transistor with an electrically floating body region wherein which electrical charges may be stored. The electrical charges stored in the electrically floating body region may represent a logic high (e.g., binary "1" data state) or a logic low (e.g., binary "0" data state). Also, a semiconductor memory device may be fabricated with semiconductor-on-insulator (SOI) substrates or bulk substrates (e.g., enabling body isolation). For example, a semiconductor memory device may be fabricated as a three-dimensional (3-D) device (e.g., multiple gate devices, Fin-FETs, recessed gates and pillars).

In one conventional technique, the memory cell of the semiconductor memory device may be read by applying a bias to a drain region of the memory transistor, as well as a bias to a gate of the memory transistor that is above a threshold voltage potential of the memory transistor. As such, a conventional reading technique may involve sensing an amount of current provided/generated by/in the electrically floating body region in response to the application of the drain region bias and the gate bias to determine a state of the memory cell. For example, the memory cell may have two or more different current states corresponding to two or more different logical states (e.g., two different current conditions/states corresponding to two different logic states: a binary "0" data state and a binary "1" data state).

In another conventional technique, the memory cell of the semiconductor memory device may be written to by applying a bias to the memory transistor. As such, a conventional writing technique may result in an increase/decrease of majority charge carriers in the electrically floating body region of the memory cell. Such an excess of majority charge carriers may result from channel impact ionization, band-to-band tunneling (gate-induced drain leakage "GIDL"), or direct injection. Majority charge carriers may be removed via drain region hole removal, source region hole removal, or drain and source region hole removal, for example, using back gate pulsing.

Often, conventional reading and/or writing operations may lead to relatively large power consumption and large voltage potential swings which may cause disturbance to unselected memory cells in the semiconductor memory device. Also, pulsing between positive and negative gate biases during read and write operations may reduce a net quantity of majority charge carriers in the electrically floating body region of the memory cell in the semiconductor memory device, which, in turn, may result in an inaccurate determination of the state of the memory cell. Furthermore, in the event that a bias is applied to the gate of the memory transistor that is below a threshold voltage potential of the memory transistor, a channel of minority charge carriers beneath the gate may be eliminated. However, some of the minority charge carriers may remain "trapped" in interface defects. Some of the trapped minority charge carriers may recombine with majority charge carriers, which may be attracted to the gate as a result of the applied bias. As a result, the net quantity of majority charge carriers in the electrically floating body region may be reduced. This phenomenon, which is typically characterized as charge pumping, is problematic because the net quantity of majority charge carriers may be reduced in the electrically floating body region of the memory cell, which, in turn, may result in an inaccurate determination of the state of the memory cell.

In view of the foregoing, it may be understood that there may be significant problems and shortcomings associated with conventional techniques for fabricating and/or operating semiconductor memory devices.

SUMMARY OF THE DISCLOSURE

Techniques for providing a direct injection semiconductor memory device having ganged carrier injection lines are disclosed. In one particular exemplary embodiment, the techniques may be realized as an apparatus comprising a first region coupled to a bit line and a second region coupled to a source line. The apparatus may also comprise a body region spaced apart from and capacitively coupled to a word line, wherein the body region is electrically floating and disposed between the first region and the second region. The apparatus may further comprise a third region coupled to a constant voltage source via a carrier injection line configured to inject charges into the body region through the second region.

In accordance with other aspects of the particular exemplary embodiment, the first region, the body region, and the second region may form a first bipolar transistor.

In accordance with further aspects of this particular exemplary embodiment, the body region, the second region, and the third region may form a second bipolar transistor.

In accordance with additional aspects of this particular exemplary embodiment, the carrier injection line may contact the third region.

In accordance with additional aspects of this particular exemplary embodiment, the constant voltage source may apply a positive bias to the third region via the carrier injection line.

In accordance with yet another aspect of this particular exemplary embodiment, the constant voltage source may apply 0V or a negative bias to the third region via the carrier injection line.

In accordance with other aspects of the particular exemplary embodiment, the constant voltage source may be coupled to a plurality of the carrier injection lines.

In accordance with further aspects of this particular exemplary embodiment, the bit line may extend from the first region perpendicular to at least one of the source line, the word line, and the carrier injection line.

In accordance with additional aspects of this particular exemplary embodiment, the word line may extend from near the body region horizontally parallel to the carrier injection line.

In accordance with yet another aspect of this particular exemplary embodiment, the source line may extend from the second region horizontally parallel to at least one of the word line and the carrier injection line.

In accordance with other aspects of the particular exemplary embodiment, the apparatus may further comprise a fourth region disposed between the third region and a substrate.

In accordance with further aspects of this particular exemplary embodiment, the fourth region may be N-doped region and the substrate is a P-type substrate.

In accordance with additional aspects of this particular exemplary embodiment, the first region and the second region may be N-doped regions.

In accordance with yet another aspect of this particular exemplary embodiment, the body region and the third region may be P-doped regions.

In another exemplary embodiment, the technique may be realized as a method for providing a direct injection semiconductor memory device. The method may comprise coupling a first region to a bit line and coupling a second region to a source line. The method may also comprise coupling a body region spaced apart from and capacitively to a word line, wherein the body region is electrically floating and disposed between the first region and the second region. The method may further comprise coupling a third region to a constant voltage source via a carrier injection line configured to inject charges into the body region through the second region.

In accordance with other aspects of the particular exemplary embodiment, the constant voltage source may apply a positive bias to the third region via the carrier injection line.

In accordance with further aspects of this particular exemplary embodiment, the constant voltage source may apply 0V or a negative bias to the third region via the carrier injection line.

In accordance with additional aspects of this particular exemplary embodiment, the constant voltage source may be coupled to a plurality of the carrier injection lines.

In accordance with yet another aspect of this particular exemplary embodiment, the bit line may extend from the first region perpendicular to at least one of the source line, the word line, and the carrier injection line.

In accordance with other aspects of the particular exemplary embodiment, the word line may extend from near the body region horizontally parallel to the carrier injection line.

In accordance with further aspects of this particular exemplary embodiment, the source line may extend from the second region horizontally parallel to at least one of the word line and the carrier injection line.

In accordance with additional aspects of this particular exemplary embodiment, the method may further comprise a fourth region disposed between the third region and a substrate.

In accordance with yet another aspect of this particular exemplary embodiment, the fourth region may be N-doped region and the substrate is a P-type substrate.

In accordance with other aspects of the particular exemplary embodiment, the first region and the second region may be N-doped regions.

In accordance with further aspects of this particular exemplary embodiment, the body region and the third region may be P-doped regions.

In another exemplary embodiment, the technique may be realized as a method for biasing a direct injection semiconductor memory device. The method may comprise applying a first voltage potential to a first region via a bit line and applying a second voltage potential to a second region via a source line. The method may also comprise applying a third voltage potential to a word line, wherein the word line is spaced apart from and capacitively to a body region that is electrically floating and disposed between the first region and the second region. The method may further comprise applying a constant voltage potential to a third region via a carrier injection line.

In accordance with other aspects of the particular exemplary embodiment, the method may further comprise increasing the third voltage potential applied to the word line from the third voltage potential applied to the word line during a hold operation to perform a read operation.

In accordance with further aspects of this particular exemplary embodiment, the method may further comprise lowering the first voltage potential applied to the bit line from the first voltage potential applied to the bit line during a hold operation to perform a read operation.

In accordance with additional aspects of this particular exemplary embodiment, the method may further comprise increasing the third voltage potential applied to the word line from the third voltage potential applied to the word line during a hold operation to perform a write logic low operation.

In accordance with yet another aspect of this particular exemplary embodiment, the method may further comprise lowering the first voltage potential applied to the first region via the bit line from the first voltage potential applied to the first region during a hold operation to perform a write logic low operation.

In accordance with other aspects of the particular exemplary embodiment, the method may further comprise lowering the second voltage potential applied to the second region via the source line from the second voltage potential applied to the second region during a hold operation to perform a write logic low operation.

In accordance with further aspects of this particular exemplary embodiment, the method may further comprise lowering the third voltage potential applied to the word line from the third voltage potential applied to the word line during a write logic low operation to perform a write logic high operation.

In accordance with additional aspects of this particular exemplary embodiment, the method may further comprise maintaining the first voltage potential applied to the bit line from the first voltage potential applied to the bit line during a write logic low operation to perform a write logic high operation.

In accordance with yet another aspect of this particular exemplary embodiment, the method may further comprise maintaining the second voltage potential applied to the source line from the second voltage potential applied to the source line during a write logic low operation to perform a write logic high operation.

In another exemplary embodiment, the technique may be realized as an apparatus comprising a first P-doped region coupled to a bit line and a second P-doped region coupled to a source line. The apparatus may also comprise a body region spaced apart from and capacitively coupled to a word line, and wherein the body region may be electrically floating and disposed between the first P-doped region and the second P-doped region. The apparatus may further comprise a third N-doped region coupled to a constant voltage source via a carrier injection line configured to inject charges into the body region through the second P-doped region.

In accordance with other aspects of the particular exemplary embodiment, the body region may be an N-doped region.

In accordance with other aspects of the particular exemplary embodiment, the constant voltage source may apply a positive bias to the third N-doped region via the carrier injection line.

In accordance with further aspects of this particular exemplary embodiment, the constant voltage source may apply 0V or a negative bias to the third N-doped region via the carrier injection line.

In accordance with additional aspects of this particular exemplary embodiment, the constant voltage source may be coupled to a plurality of the carrier injection lines.

In accordance with yet another aspect of this particular exemplary embodiment, the apparatus may further comprise a fourth region disposed between the third N-doped region and a substrate.

In another exemplary embodiment, the technique may be realized as a direct injection semiconductor memory device comprising a first region coupled to a bit line and a second region directly coupled to a source line and capacitively coupled to a field-effect transistor word line. The direct injection semiconductor memory device may also comprise a body region spaced apart from and capacitively coupled to a word line, wherein the body region is electrically floating and disposed between the first region and the second region. The direct injection semiconductor memory device may further comprise a third region coupled to a carrier injection line.

In another exemplary embodiment, the technique may be realized as a direct injection semiconductor memory device comprising a first region coupled to a bit line and a second region coupled to a source line. The direct injection semiconductor memory device may also comprise a body region spaced apart from and capacitively coupled to a word line, wherein the body region is electrically floating and disposed between the first region and the second region. The direct injection semiconductor memory device may further comprise a third region coupled to a carrier injection line, wherein at least a portion of the third region is directly coupled to the second region.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
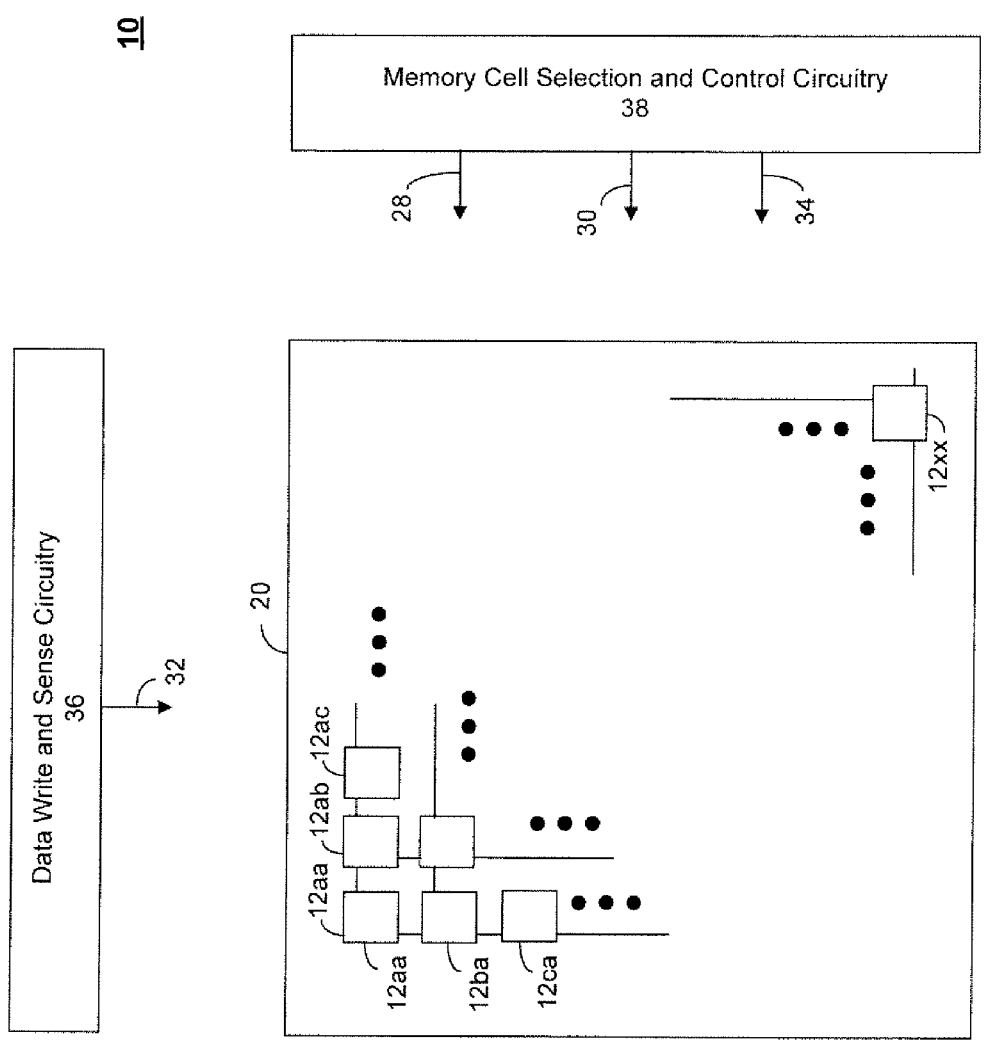
FIG. 1 shows a block diagram of a semiconductor memory device including a memory cell array, data write and sense circuitry, and memory cell selection and control circuitry in accordance with an embodiment of the present disclosure.

Referring to FIG. 1, there is shown a block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a word line (WL) 28, a source line (CN) 30, and a carrier injection line (EP) 34, and to the data write and sense circuitry 36 via a bit line (EN) 32. It may be appreciated that the source line (CN) 30 and the bit line (EN) 32 are designations used to distinguish between two signal lines and they may be used interchangeably. The data write and sense circuitry 36 may read data from and may write data to selected memory cells 12. In an exemplary embodiment, the data write and sense circuitry 36 may include a plurality of data sense amplifiers. Each data sense amplifier may receive at least one bit line (EN) 32 and a current or voltage reference signal. For example, each data sense amplifier may be a cross-coupled type sense amplifier to sense a data state stored in a memory cell 12.

Each data sense amplifier may employ voltage and/or current sensing circuitry and/or techniques. In an exemplary embodiment, each data sense amplifier may employ current sensing circuitry and/or techniques. For example, a current sense amplifier may compare current from a selected memory cell 12 to a reference current (e.g., the current of one or more reference cells). From that comparison, it may be determined whether the selected memory cell 12 stores a logic high (e.g., binary "1" data state) or a logic low (e.g., binary "0" data state). It may be appreciated by one having ordinary skill in the art that various types or forms of the data write and sense circuitry 36 (including one or more sense amplifiers, using voltage or current sensing techniques, to sense a data state stored in a memory cell 12) may be employed to read data stored in memory cells 12 and/or write data to memory cells 12.

Also, the memory cell selection and control circuitry 38 may select and/or enable one or more predetermined memory cells to facilitate reading data therefrom and/or writing data thereto by applying control signals on one or more word lines (WL) 28, source lines (CN) 30, and/or carrier injection lines (EP) 34. The memory cell selection and control circuitry 38 may generate such control signals from address signals, for example, row address signals. Moreover, the memory cell selection and control circuitry 38 may include a word line decoder and/or driver. For example, the memory cell selection and control circuitry 38 may include one or more different control/selection techniques (and circuitry therefor) to select and/or enable one or more predetermined memory cells 12. Notably, all such control/selection techniques, and circuitry therefor, whether now known or later developed, are intended to fall within the scope of the present disclosure.

In an exemplary embodiment, the semiconductor memory device may implement a two step write operation whereby all the memory cells 12 in a row of memory cells 12 may be written to a predetermined data state by first executing a "set" or a logic high (e.g., binary "1" data state) write operation, whereby all of the memory cells 12 in the row of memory cells 12 are written to logic high (e.g., binary "1" data state). Thereafter, selected memory cells 12 in the row of memory cells 12 may be selectively written to the predetermined data state (e.g., a logic low (binary "0" data state)). The semiconductor memory device 10 may also implement a one step write operation whereby selective memory cells 12 in a row of memory cells 12 may be selectively written to either a logic high (e.g., binary "1" data state) or a logic low (e.g., binary "0" data state) without first implementing a "set" operation. The semiconductor memory device 10 may employ any of the exemplary writing, preparation, holding, refresh, and/or reading techniques described herein.

The memory cells 12 may comprise N-type, P-type and/or both types of transistors. Circuitry that is peripheral to the memory array 20 (for example, sense amplifiers or comparators, row and column address decoders, as well as line drivers (not illustrated herein)) may also include P-type and/or N-type transistors. Regardless of whether P-type or N-type transistors are employed in memory cells 12 in the memory cell array 20, suitable voltage potentials (for example, positive or negative voltage potentials) for reading from and/or writing to the memory cells 12 should be well known to those skilled in the art in light of this disclosure. Accordingly, for sake of brevity, a discussion of such suitable voltage potentials will not be included herein.

Figure 2:
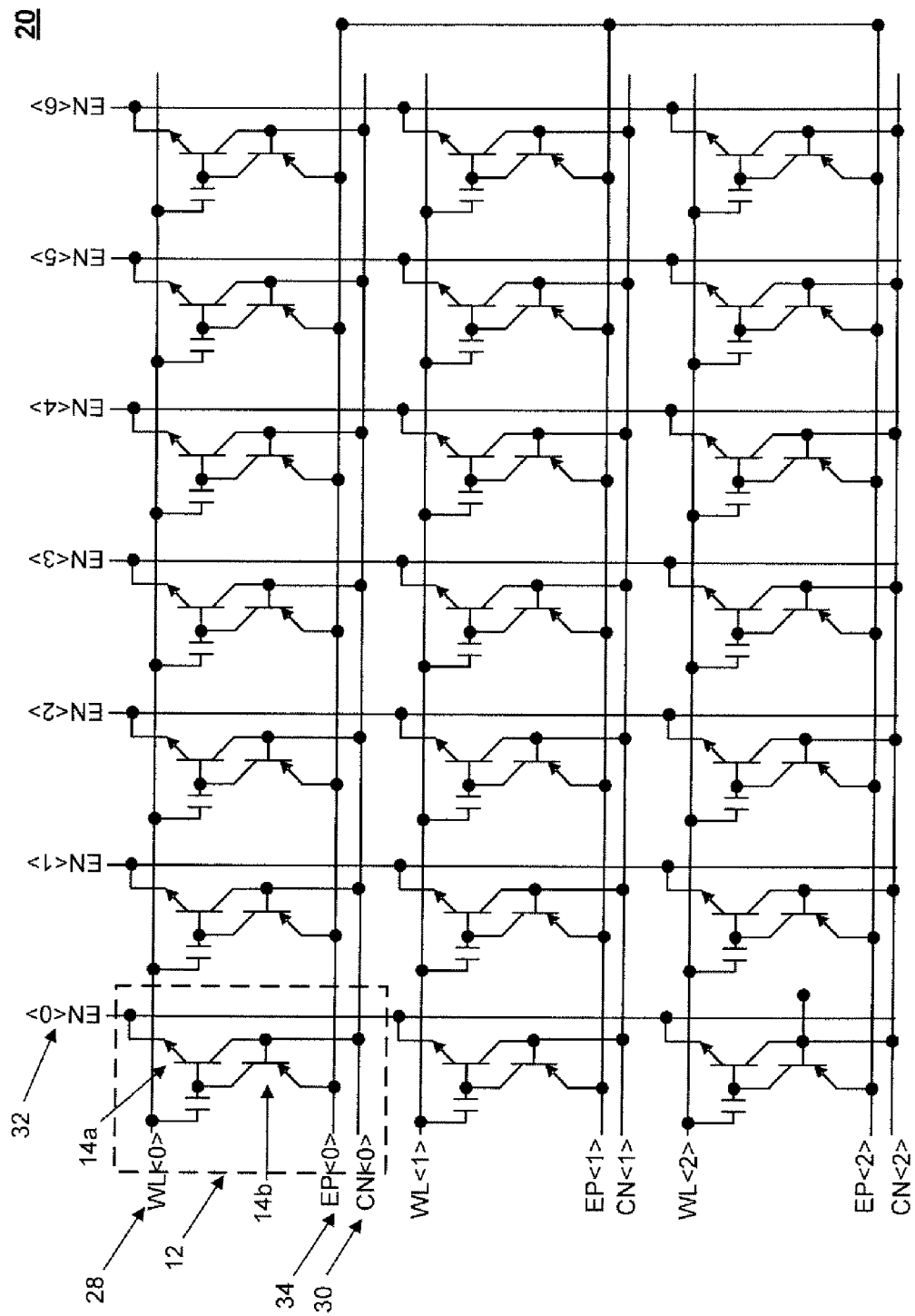
FIG. 2 shows a schematic diagram of at least a portion of the memory cell array having a plurality of memory cells in accordance with an embodiment of the present disclosure.

Referring to FIG. 2, there is shown a schematic diagram of at least a portion of the memory cell array 20 having the plurality of memory cells 12 in accordance with an embodiment of the present disclosure. Each of the memory cells 12 may comprise a first bipolar transistor 14a and a second bipolar transistor 14b coupled to each other. For example, the first bipolar transistor 14a and/or the second bipolar transistor 14b may be an NPN bipolar transistor or an PNP bipolar transistor. As illustrated in FIG. 2, the first bipolar transistor 14a may be an NPN bipolar transistor and the second bipolar transistor 14b may be an PNP bipolar transistor. In another exemplary embodiment, the first memory transistor 14a may be an PNP bipolar transistor and the second memory transistor 14b may be an NPN bipolar transistor. Each memory cell 12 may be coupled to a respective word line (WL) 28, a respective source line (CN) 30, a respective bit line (EN) 32, and a respective carrier injection line (EP) 34. Data may be written to or read from a selected memory cell 12 by applying suitable control signals to a selected word line (WL) 28, a selected source line (CN) 30, a selected bit line (EN) 32, and/or a selected carrier injection line (EP) 34. In an exemplary embodiment, each word line (WL) 28, each source line (CN) 30, and carrier injection line (EP) 34 may extend horizontally parallel to each other in a row direction. Each bit line (EN) 32 may extend vertically in a column direction perpendicular to each word line (WL) 28, source line (CN) 30, and/or carrier injection line (EP) 34.

In an exemplary embodiment, one or more respective bit line (EN) 32 may be coupled to one or more data sense amplifiers (not shown) of the data write and sense circuitry 36 to read data states of one or more memory cells. A data state may be read from one or more selected memory cells 12 by applied one or more control signals. A voltage and/or a current may be generated by the one or more selected memory cells 12 and outputted to the data write and sense circuitry 36 via a corresponding bit line (EN) 32 in order to read a data state stored in each selected memory cell 12. Also, a data state may be written to one or more selected memory cells 12 by applying one or more control signals to one or more selected memory cells 12 via a selected word line (WL) 28, a selected source line (CN) 30, a selected bit line (EN) 32, and/or a selected carrier injection line (EP) 34. The one or more control signals applied to one or more selected memory cells 12 via a selected word line (WL) 28, selected source line (CN) 30, a selected bit line (EN) 32, and/or a selected carrier injection line (EP) 34 may control the first bipolar transistor 14a of each selected memory cell 12 in order to write a desired data state to each selected memory cell 12. In the event that a data state is read from a selected memory cell 12 via the bit lines (EN) 32, then only the bit line (EN) 32 may be coupled to the data sense amplifier of the data write and sense circuitry 36 while the source line (CN) 30 may be separately controlled via a voltage/current source (e.g., a voltage/current driver) of the memory cell selection and control circuitry 38.

The carrier injection lines (EP) 34 corresponding to different rows of the memory cell array 20 may be coupled to each other. In an exemplary embodiment, the carrier injection lines (EP) 34 (e.g., EP<0>, EP<1>, and EP<2>) of the memory cell array 20 may be coupled together and driven by subcircuits of the memory cell selection and control circuitry 38 (e.g., driver, inverter, and/or logic circuits) or biased at a constant voltage potential. The subcircuits coupled to each carrier injection line (EP) 34 may be independent voltage drivers located within and/or integrated with the memory cell selection and control circuitry 38. To reduce an amount of space taken by the subcircuits of the memory cell selection and control circuitry 38, a plurality of carrier injection lines (EP) 34 of the memory cell array 20 may be coupled to a single subcircuit within the memory cell selection and control circuitry 38. In other exemplary embodiments, a plurality of carrier injection lines (EP) 34 of the memory cell array may be coupled to a voltage potential generating circuit located outside of the memory cell selection and control circuitry 38. In an exemplary embodiment, the subcircuits of the memory cell selection and control circuitry 38 may bias a plurality of carrier injection lines (EP) 34 coupled together to different voltage and/or current levels (e.g., 0V, 1.0V, etc).

As illustrated in FIG. 2, three rows of carrier injection lines (EP) 34 may be coupled together, however, it may be appreciated by one skilled in the art that the number of rows of carrier injection lines (EP) 34 coupled together within the memory cell array 20 may vary. For example, four rows of carrier injection lines (EP) 34, sixteen rows of carrier injection lines (EP) 34, thirty-two rows of carrier injection lines (EP) 34, and/or sixty-four rows of carrier injection lines (EP) 34 may be coupled together.

Figure 3:
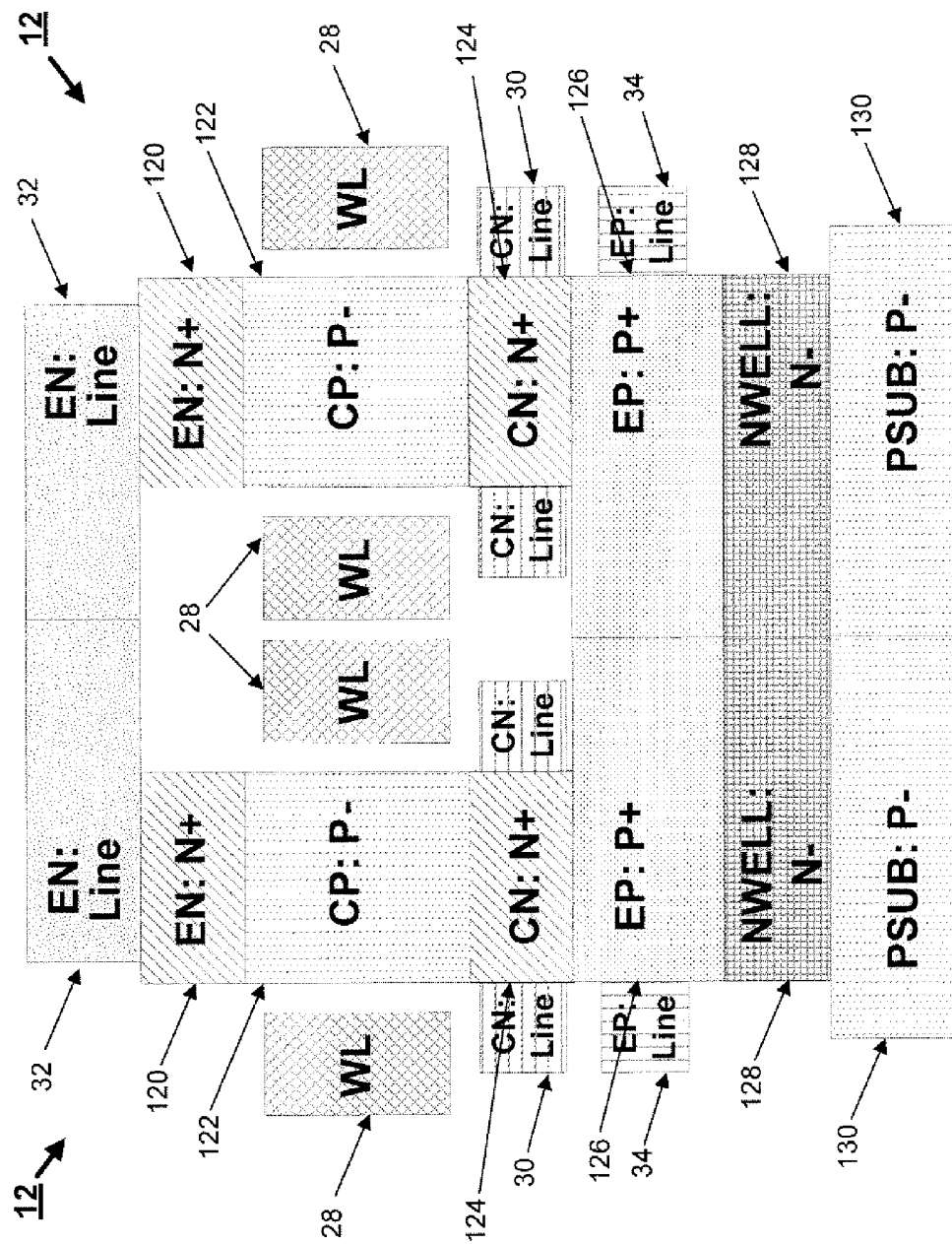
FIG. 3 shows a cross-sectional view of two memory cells along a column direction of a memory cell array in accordance with an embodiment of the present disclosure.

Referring to FIG. 3, there is shown a cross-sectional view of two memory cells 12 along a column direction of the memory cell array 20 shown in FIG. 1 in accordance with an embodiment of the present disclosure. As discussed above, each memory cell 12 may comprise two bipolar transistors. In an exemplary embodiment, the first bipolar transistor 14a may be a NPN bipolar transistor and the second bipolar transistor 14b may be a PNP bipolar transistor. In an exemplary embodiment, the first bipolar transistor 14a and the second bipolar transistor 14b may share one or more common regions. The first NPN bipolar transistor 14a may comprise an N+ emitter region 120, a P− base region 122, and an N+ collector region 124. The second PNP bipolar transistor 14b may comprise the P− collector region 122, the N+ base region 124, and an P+ emitter region 126. The N+ region 120, the P− region 122, the N+ region 124, and/or the P+ region 126 may be disposed in sequential contiguous relationship within a pillar or fin configuration that may extend vertically to a plane defined by an N-well region 128 and/or an P− substrate 130. In an exemplary embodiment, the P− region 122 may be an electrically floating body region of the memory cell configured to accumulate/store charges, and may be spaced apart from and capacitively coupled to the word line (WL) 28.

As shown in FIG. 3, the N+ emitter region 120 of the first bipolar transistor 14a may be coupled to a corresponding bit line (EN) 32. In an exemplary embodiment, the N+ emitter region 120 of the first bipolar transistor 14a may be formed of a semiconductor material (e.g., silicon) comprising donor impurities and coupled to the bit line (EN) 32. In an exemplary embodiment, the bit line (EN) 32 may be formed of a metal layer. In another exemplary embodiment, the bit line (EN) 32 may be formed of a polycide layer (e.g., a combination of a metal material and a silicon material). The bit line (EN) 32 may provide a means for accessing one or more selected memory cells 12 on a selected row.

As also shown in FIG. 3, the P− base region 122 of the first bipolar transistor 14a or the P− collector region 122 of the second bipolar transistor 14b may be capacitively coupled to a corresponding word line (WL) 28. The P− region 122 may be formed of a semiconductor material (e.g., intrinsic silicon) comprising acceptor impurities and capacitively coupled to the word line (WL) 28. The P− region 122 and the word line (WL) 28 may be capacitively coupled via an insulating or dielectric material. Also, the word line (WL) 28 may be formed of a polycide layer or a metal layer extending in a row direction of the memory cell array 20.

As further shown in FIG. 3, the N+ region 124 of the memory cell 12 may be coupled to a source line (CN) 30. The N+ region 124 may be formed of a semiconductor material (e.g., silicon) comprising donor impurities. In an exemplary embodiment, the source line (CN) 30 may be formed of a polycide layer. In another exemplary embodiment, the source line (CN) 30 may be formed of a metal layer. The source line (CM) 30 may circumferentially surround the N+ region 124 of the memory cell 12. The source line (CN) 30 may reduce a disturbance to the memory cell 12. For example, the source line (CN) 30 may be formed of a metal layer and therefore may reduce a hole disturbance in the memory cell 12. The source line (CN) 30 may extend horizontally in parallel to the word line (WL) 28 and/or the carrier injection line (EP) 34, and may be coupled to a plurality of memory cells 12 (e.g., a row of memory cells 12). For example, the source line (CN) 30 and the word line (WL) 28 and/or the carrier injection line (EP) 34 may be arranged in different planes and configured to be parallel to each other. In an exemplary embodiment, the source line (CN) 30 may be arranged in a plane between a plane containing the word line (WL) 28 and a plane containing the carrier injection line (EP) 34.

As further shown in FIG. 3, the P+ emitter region 126 of the second bipolar transistor 14a may be coupled to the carrier injection line (EP) 34. The P+ region 126 may be formed of a semiconductor material (e.g., silicon) comprising acceptor impurities and directly coupled to the carrier injection line (EP) 34. In an exemplary embodiment, the P+ region 126 may be configured as an input region for charges to be stored in the P− region 122 of the memory cell 12. The charges to be stored in the P− region 122 of the memory cell 12 may be supplied by the carrier injection line (EP) 34 and input into the P− region 122 via the P+ region 126.

The carrier injection line (EP) 34 may be formed of a polycide layer or a metal layer extending in a row direction of the memory cell array 20. For example, the carrier injection line (EP) 34 may extend horizontally in parallel to the word line (WL) 28 and/or the source line (CN) 30, and may be coupled to a plurality of memory cells 12 (e.g., a row of memory cells 12). For example, the carrier injection line (EP) 34 and the word line (WL) 28 and/or the source line (CN) 30 may be arranged in different planes and configured to be parallel to each other. In an exemplary embodiment, the carrier injection line (EP) 34 may be arranged in a plane below a plane containing the word line (WL) 28 and a plane containing the source line (CN) 30. In another exemplary embodiment, the carrier injection line (EP) 34 may be removed when the P+ region 126 may form a continuous plane for the entire memory cell array 20.

As discussed above, carrier injection lines (EP) 34 corresponding to different rows of the memory cell array 20 may be coupled to each other in order to bias and/or access memory cells 12 in different rows of the memory cell array 20. Thus, in an exemplary embodiment, P+ regions 126 of memory cells 12 in different rows of memory cell array 20 may be coupled to each other by coupling the carrier injection lines (EP) 34 corresponding to different rows of the memory cell array 20. In another exemplary embodiment, carrier injection lines (EP) 34 corresponding to different rows of the memory cell array 20 may be coupled to each other via a carrier injection line plate, carrier injection grid, or a combination of a carrier injection line plate and a carrier injection grid.

As further shown in FIG. 3, the N-well region 128 may be disposed between the P+ region 126 and the P− substrate 130. The N-well region 128 may be formed of a semiconductor material (e.g., silicon) comprising donor impurities and extending in a planar direction parallel to the P− substrate 130. In an exemplary embodiment, the N-well region 128 may comprise a strip protruding portion corresponding to each row of the memory cell array 20. For example, the strip protruding portion of the N-well region 128 may be configured to accommodate a row of memory cells 12 of the memory cell array 20.

In an exemplary embodiment, the P− substrate 130 may be made of a semiconductor material (e.g., silicon) comprising acceptor impurities and form the base of the memory cell array 20. In alternative exemplary embodiments, a plurality of P− substrates 130 may form the base of the memory cell array 20 or a single P− substrate 130 may form the entire base of the memory cell array 20.

Figure 4:
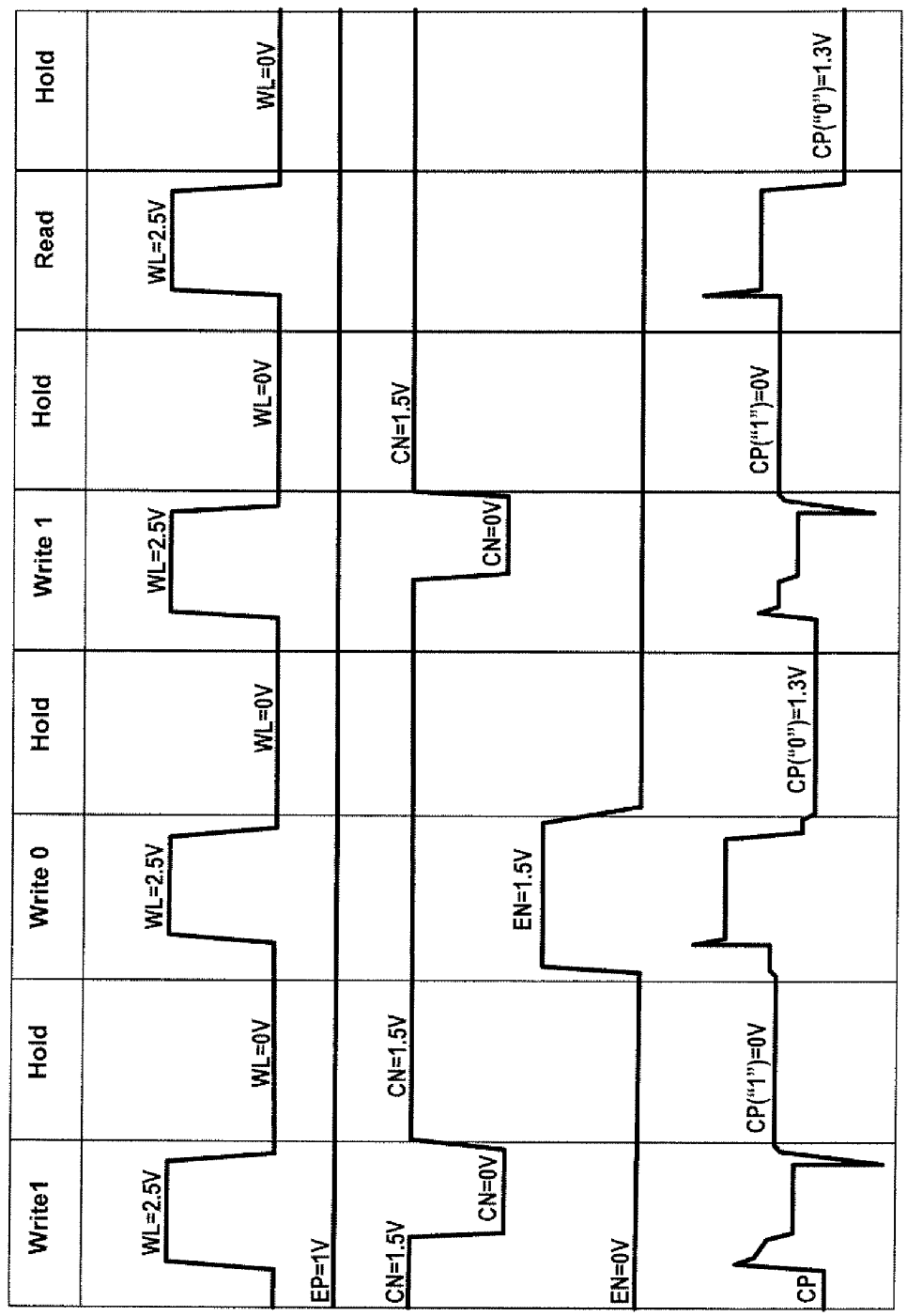
FIG. 4 shows control signal voltage waveforms for performing write and read operations on a memory cell in accordance with an embodiment of the present disclosure.

Referring to FIG. 4, there are shown control signal voltage waveforms for performing write and read operations on a memory cell in accordance with an embodiment of the present disclosure. A write operation may include a write logic high (e.g., binary "1" data state) operation and a write logic low (e.g., binary "0" data state) operation. Also, each write logic high (e.g., binary "1" data state) operation and write logic low (e.g., binary "0" data state) operation may include a plurality of steps of write operation. For example, a write logic high (e.g., binary "1" data state) operation may include a two step write operation. The first step write operation of the write logic high (e.g., binary "1" data state) may be a write logic low (e.g., binary "0" data state) operation and the second step write operation of the write logic high (e.g., binary "1" data state) may be a write logic high (e.g., binary "1" data state) operation. The first step (e.g., write logic low (binary "0" data state) operation) of the write logic high (e.g., binary "1" data state) operation may include control signals configured to "clear" majority charges stored in one or more selected memory cells 12 of one or more selected rows of the memory cell array 20.

In an exemplary embodiment, a voltage potential applied to the word line (WL) 28 may be adjusted, such that the voltage potential at the P− region 122 (e.g., by capacitively coupling to the word line (WL) 28) may be higher than a voltage potential applied to the bit line (EN) 32 and/or the source line (CN) 30 by a predetermined voltage potential. The predetermined voltage potential may be a threshold voltage potential or forward bias voltage potential of the first bipolar transistor 14a and/or the second bipolar transistor 14b. For example, the predetermined voltage potential may be approximately 0.7V.

In an exemplary embodiment, a voltage potential applied to the word line (WL) 28 (e.g., capacitively coupled to the P− region 122) may be raised to 2.5V from 0V. Also, a voltage potential applied to the bit line (EN) 32 may be maintained at 0V, a voltage potential applied to the source line (CN) 30 may be maintained at 1.5V, and a voltage potential applied to the carrier injection line (EP) 34 may be maintained at 1.0V. In an exemplary embodiment, when the voltage potential applied to the word line (WL) 28 (e.g., capacitively coupled to the P− region 122 of the memory cell 12) is raised to 2.5V, the voltage potential applied to the N+ region 120 via the bit line (EN) 32 is maintained at 0V, the voltage potential applied to the N+ region 124 via the source line (CN) 30 is maintained at 1.5V, and the voltage potential applied to the P+ region 126 via the carrier injection line (EP) 34 is maintained at 1.0V, the first bipolar transistor 14a (e.g., regions 120-124) may be switched to an "ON" state to remove charges stored in the P− region 122 through the forward biased junction between the P− region 122 and the N+ region 120 in order to perform the first step (e.g., write logic low (binary "0" data state) operation) of the write logic high (e.g., binary "1" data state) operation.

In another exemplary embodiment, a write logic high (e.g., binary "1" data state) operation may be a single step write operation and may not include the first step write operation (e.g., write logic low (binary "0" data state) operation). For example, a voltage potential applied to the word line (WL) 28 (e.g., capacitively coupled to the P− region 122) may be maintained at 0V and the junction between the P− region 122 and the N+ region 120 may not be forward biased and cause the first bipolar transistor 14a to remain in an "OFF" state. The charges previously stored in the P− region 122 of the memory cell 12 may remain in the P− region 122 because the first bipolar transistor 14a may remain in the "OFF" state.

During the second step of the write logic high (e.g., binary "1" data state) operation, a predetermined voltage potential may be applied to the word line (WL) 28 (e.g., capacitively coupled to the P− region 122), the N+ region 124 via the source line (CN) 30, the N+ region 120 via the bit line (EN) 32, and/or the P+ region 126 via the carrier injection line (EP) 34. The voltage potential applied to the N+ region 124 via the source line (CN) 30 may be lowered in order to forward bias the junction between the N+ region 124 and the + region 126 and switch the second bipolar transistor 14b to an "ON" state. In an exemplary embodiment, a voltage potential applied to the N+ region 124 via the source line (CN) 30 may be lowered to 0V from 1.5V. Also, the voltage potential applied to the word line (WL) 28 may maintain at 2.5V, the voltage potential applied to the N+ region 120 via the bit line (EN) 32 may maintain at 0V, and the voltage potential applied to the P+ region 126 via the carrier injection line (EP) 34 may maintain at 1.0V.

As discussed above, when the voltage potential applied to the N+ region 124 may be lowered to 0V, the junction between the N+ region 124 and the P+ region 126 may be forward biased and charges may be injected into the floating P− region 122 via the P+ region 126 and a logic high (e.g., binary "1" data state) may be written to the memory cell 12. The floating P− region 122 may be charged to approximately 0.7V because the voltage potential applied to the N+ region 120 via the bit line (EN) 32 may be maintained at 0V. For example, a voltage potential higher than 0.7V may forward bias the junction between the N+ region 120 and the floating P− region 122 and additional charges (e.g., higher than 0.7V) injected into the floating P− region 122 may be leaked via the N+ region 120.

At the end of the write logic high (e.g., binary "1" data state) operation, the voltage potentials applied to the memory cells 12 may adjust the amount of charge (e.g., an indication of data state) stored in the memory cells 12. In an exemplary embodiment, a voltage potential applied to the word line (WL) 28 (e.g., capacitively coupled to the floating P− region 122) may be lowered to 0V from 2.5V. As discussed above, the floating P− region 122 may be charged to approximately 0.7V above the voltage potential at the N+ region 120 during the second step of the write logic high (e.g., binary "1" data state) operation. The voltage potential applied to the word line (WL) 28 (e.g., capacitively coupled to the floating P− region 122) may be lowered to 0V and may determine an amount of charge (e.g., an indication of data state) stored in the floating P− region 122 of the memory cells 12. In an exemplary embodiment, the floating P− region 122 of the memory cell 12 may be charged to approximately 0.7V when the voltage potential applied on the word line (WL) 28 is 2.5V, however, when the voltage potential on the word line (WL) 28 is lowered to 0V (e.g., a holding voltage potential) the voltage potential at the floating P− region 122 may be lowered by some fraction of 2.5V due to the capacitive coupling of the voltage potential to the word line (WL) 28. Because the voltage potential at the floating P− region 122 may be lowered due to the capacitive coupling to the word line (WL) 28, the charges may continue to be injected into the floating P− region 122 until the voltage potential at the floating P− region 122 is again approximately 0.7V above the voltage potential at the N+ region 120.

Also, at the conclusion of the write logic high (e.g., binary "1" data state) operation, the voltage potential applied to the N+ region 124 may be raised to a predetermined voltage potential to stop the charge injection into the floating P− region 122 by eliminating the forward bias at the junction of the N+ region 124 and the P+ region 126 and switch the second bipolar transistor 14b to an "OFF" state. In other exemplary embodiments, as more charges are accumulated in the floating P− region 122, the voltage potential at the floating P− region 122 may increase to approximately 0.7V above the voltage potential at N+ region 124. At this time, the first bipolar transistor 14a may start to turn to an "ON" state and the current generated by the first bipolar transistor 14a may increase the voltage potential at N+ region 124 due to resistive voltage potential drop on the source line (CN) 30. The increase of the voltage potential at N+ region 124 may lead to a decrease of current flow in the second bipolar transistor 14b which in term may cause a decrease in the current load on the carrier injection line (EP) 34 after the write logic high (e.g., binary "1" data state) operation has been completed. In another exemplary embodiment, the N+ region 124 may be floating after pre-charged to a predetermined voltage potential (e.g., 0V as discussed above) in order to reduce a current flow within the second bipolar transistor 14b. Thus, during a write logic high (e.g., binary "1" data state) operation, the first bipolar transistor 14a may easily increase the voltage potential at the N+ region 124 when the P− region 122 is fully charged.

After the completion of a write logic high (e.g., binary "1" data state) operation, voltage potentials applied to the memory cell 12 may be maintained at a holding voltage potential. In particular, the control signals may be configured to maximize a retention time of a data state (e.g., a logic low (binary "0" data state) and/or a logic high (binary "1" data state)) stored in the memory cell 12. Also, the control signals for the hold operation may be configured to eliminate or reduce activities or field (e.g., electrical fields across junctions which may lead to leakage of charges) within the memory cell 12. In an exemplary embodiment, during a hold operation, the voltage potential applied to the word line (WL) 28 (e.g., capacitively coupled to the floating P− region 122) and the N+ region 120, may be maintained at 0V. Also, the voltage potential applied to the N+ region 124 via the source line (CN) 30 may be maintained at 1.5V and the P+ region 126 via the carrier injection line (EP) 34 may be maintained at 1.0V. During the hold operation, the junction between the N+ region 124 and the P− region 122 and the junction between the N+ region 120 and the P− region 122 may be reverse biased in order to retain a data state (e.g., a logic high (binary "1" data state) or a logic low (binary "0" data state)) stored in the memory cell 12.

The write operation may also include a write logic low (e.g., binary "0" data state) operation. In an exemplary embodiment, a voltage potential applied to the word line (WL) 28 may be adjusted, such that the voltage potential at the P− region 122 (e.g., by capacitively coupling to the word line (WL) 28) may be higher than a voltage potential applied to the bit line (EN) 32 and/or the source line (CN) 30 by a predetermined voltage potential. The predetermined voltage potential may be a threshold voltage potential or forward bias voltage potential of the first bipolar transistor 14a and/or the second bipolar transistor 14b. For example, the predetermined voltage potential may be approximately 0.7V.

In an exemplary embodiment, a voltage potential applied to the word line (WL) 28 (e.g., capacitively coupled to the P− region 122) may be raised to 2.5V from 0V. Also, a voltage potential applied to the bit line (EN) 32 may be raised to 1.5V from 0V in order to reduce a bias (e.g., a current in the first bipolar transistor 14a) of the first bipolar transistor 14a when the voltage potential applied to the word line (WL) 28 is raised. A voltage potential applied to the source line (CN) 30 may be maintained at 1.5V, and a voltage potential applied to the carrier injection line (EP) 34 may be maintained at 1.0V. In an exemplary embodiment, when the voltage potential applied to the word line (WL) 28 (e.g., capacitively coupled to the P− region 122 of the memory cell 12) is raised to 2.5V, the voltage potential applied to the N+ region 120 via the bit line (EN) 32 is raised to 1.5V, the voltage potential applied to the N+ region 124 via the source line (CN) 30 is maintained at 1.5V, and the voltage potential applied to the P+ region 126 via the carrier injection line (EP) 34 is maintained at 1.0V, the first bipolar transistor 14a (e.g., regions 120-124) may be switched to an "ON" state to remove charges stored in the P− region 122 through the forward biased junction between the P− region 122 and the N+ region 120 and the forward biased junction between the P− region 122 and the N+ region 124 in order to perform the first step (e.g., write logic low (binary "0" data state) operation) of the write logic high (e.g., binary "1" data state) operation.

After the completion of a write logic low (e.g., binary "1" data state) operation, the voltage potentials applied to the memory cell 12 may be returned to a holding voltage potential, as discussed above. Again, a write logic high (e.g., binary "1" data state) operation may be performed, as discussed above.

In another exemplary embodiment, a read operation where the control signals may be configured to read a data state (e.g., a logic low (binary "0" data state) and/or a logic high (binary "1" data state)) stored in one or more selected memory cells 12 of one or more selected rows of the memory cell array 20 may be performed. The control signals may be configured to a predetermined voltage potential to implement a read operation via the bit line (EN) 32. In an exemplary embodiment, a voltage potential applied to the word line (WL) 28 (e.g., capacitively coupled to the P− region 122) may be initially (e.g., at the start of the read operation) raised to a predetermined voltage potential. For example, the voltage potential applied to the word line (WL) 28 (e.g., capacitively coupled to the P− region 122 of the memory cell 12) may be raised to 2.5V from 0V. Also, a voltage potential applied to the bit line (EN) 32 may be maintained at 0V, a voltage potential applied to the source line (CN) 30 may be maintained at 1.5V, and a voltage potential applied to the carrier injection line (EP) 34 may be maintained at 1.0V. In an exemplary embodiment, when the voltage potential applied to the word line (WL) 28 may be raised to 2.5V, the junction between the P− region 122 and the N+ region 120 may become forward biased and switch the first bipolar transistor 14a to an "ON" state. When the first bipolar transistor 14a switches to an "ON" state, a change in voltage potential and/or current may be generated in the memory cell 12. This change in voltage potential and/or current may be outputted to and detected by a data sense amplifier via the bit line (EN) 32 coupled to the Ni+ region 120. After the completion of a read operation, voltage potentials applied to the memory cells 12 may return to a holding voltage potential, as discussed above.

Further illustrated in FIG. 4, are exemplary voltage potentials at the P– region 122 corresponding to various operations (e.g., read operation or write operation) performed on the memory cell 12.

Figure 5:
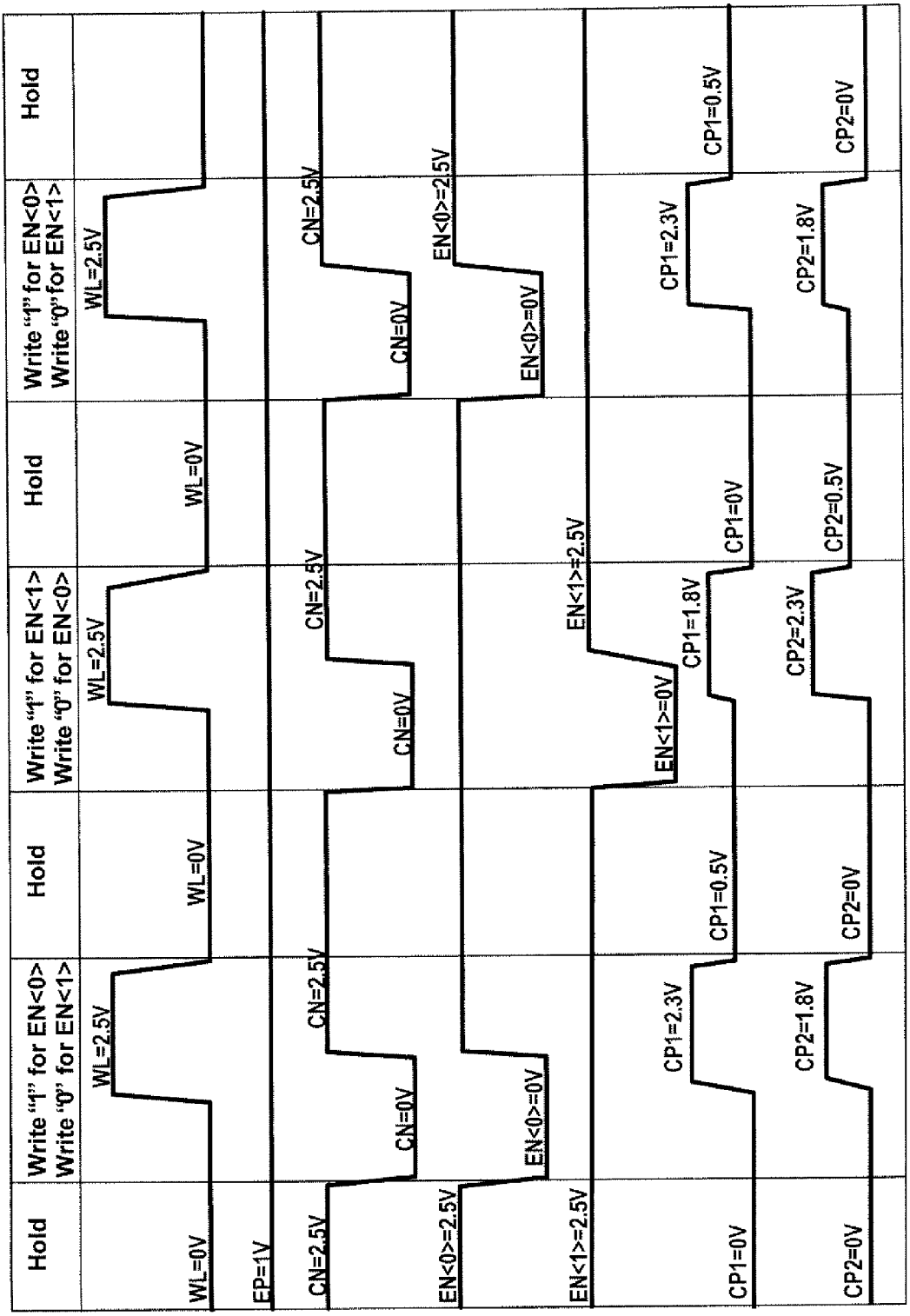
FIG. 5 shows control signal voltage waveforms for write operations performed on different columns of a memory cell array when the carrier injection line is biased high in accordance with an embodiment of the present disclosure.

Referring to FIG. 5, there are shown control signal voltage waveforms for write operations performed on different columns of a memory cell array 20 when the carrier injection line (EP) is biased high in accordance with an embodiment of the present disclosure. For example, during one or more write operations, a predetermined voltage potential may be applied to the carrier injection line (EP) 34. For example, the predetermined voltage potential applied to the carrier injection line (EP) 34 may be high or low. In an exemplary embodiment, a high predetermined voltage potential may be applied to the carrier injection line (EP) 34, for example, 1.0V. Write operations may be performed to one or more memory cells 12 (e.g., corresponding to different bit lines (EN) 32) on a selected row (e.g., corresponding to different word lines (WL) 28, source lines (CN) 30, and/or carrier injection lines (EP) 34) of the memory cell array 20. For example, different write operations may be performed to different memory cells 12 on a selected row of the memory cell array 20. In an exemplary embodiment, a write logic high (e.g., binary "1" data state) operation may be performed to a first memory cell 12 (e.g., corresponding to first bit line (EN<0>) 32), while a write logic low (e.g., binary "0" data state) operation may be performed to a second memory cell 12 (e.g., corresponding to second bit line (EN<1>) 32) on a selected row of the memory cell array 20.

As illustrated in FIG. 5, a write logic high (e.g., binary "1" data state) operation may be performed to a first memory cell 12 corresponding to a first bit line (EN<0>) 32 and a write logic low (e.g., binary "0" data state) operation may be performed to a second memory cell 12 corresponding to a second bit line (EN<1>) 32 of a selected row of the memory cell array 20. During a write logic high (e.g., binary win data state) operation, a predetermined voltage potential applied to the N+ region 124 via a corresponding source line (CN) 30 may be lowered to 0V from 2.5V (e.g., holding voltage potential). Also, a predetermined voltage potential applied to the N+ region 120 via the bit line (EN<0>) 32 may be lowered to 0V from 2.5V (e.g., holding voltage potential). In an exemplary embodiment, the predetermined voltage potential applied to the N+ region 124 and the predetermined voltage potential applied to the N+ region 120 may be lowered to 0V simultaneously from 2.5V. The lowered voltage potential applied to the N+ region 124 via the corresponding source line (CN) 30 may cause the junction between the N+ region 124 and the P+ region 126 to become forward biased and switch the second bipolar transistor 14b to an "ON" state. The majority charge carriers (e.g., holes) may be injected into the P– region 122 via the forward biased junction between the N+ region 124 and the P+ region 126 and a corresponding carrier injection line (EP) 34. An amount of majority charge carriers may be accumulated/stored in the P– region 122 to indicate that a logic high (e.g., binary "1" data state) is stored in the memory cell 12. In an exemplary embodiment, an amount of majority charge carriers accumulated/stored in the P– region 122 may be approximately 0.7V and/or until forward biasing the junction between the P– region 122 and the N+ region 124.

Thereafter, a predetermined voltage potential applied to the word line (WL) 28 may be adjusted, such that the voltage potential at the P– region 122 (e.g., by capacitively coupling to the word line (WL) 28)) may cause the junction between the P– region 122 and the N+ region 124 to become forward biased and deplete the P– region 122 of excessive majority charge carriers (e.g., holes). In an exemplary embodiment, a predetermined voltage potential applied to the word line (WL) 28 may be raised to approximately 2.5V from 0V (e.g., hold voltage potential). Subsequently, the predetermined voltage potential applied to the N+ region 124 via the source line (CN) 30 may be raised back to approximately 2.5V from 0V and the junction between the N+ region 124 and the P+ region 126 may become reverse biased and the second bipolar transistor 14b may be switched to an "OFF" state. The injection of the majority charge carriers may be stopped by reverse biasing the junction between the N+ region 124 and the P+ region 126. Also, the predetermined voltage potential applied to the N+ region 120 via the bit line (EN<0>) may be raised back to 2.5V from 0V in order to obtain a higher voltage potential at the P– region 122. At the end of a write logic high (e.g., binary "1" data state) operation, the predetermined voltage potential applied to the word line (WL) 28 may be lowered back to 0V from 2.5V in order to maintain the logic high (e.g., binary "1" data state) stored in the memory cell 12.

Also, illustrated in FIG. 5, a write logic low (e.g., binary "0" data state) operation may be performed to a second memory cell 12 corresponding to a second bit line (EN<1>) 32, while the write logic high (e.g., binary "1" data state) operation may be performed to the first memory cell 12 corresponding to the first bit line (EN<0>) 32 of a selected row of the memory cell array 20, as discussed above. The predetermined voltage potentials applied to the second memory cell 12 corresponding to the second bit line (EN<1>) 32 via the word line (WL) 28, the source line (CN) 30, the carrier injection line (EP) 34, may be similar to the predetermined voltage potentials applied to the first memory cell 12 corresponding to the first bit line (EN<0>) 32 except for a predetermined voltage potential applied to the N+ region 120 via the second bit line (EN<1>) 32.

In an exemplary embodiment, a predetermined voltage potential applied to the N+ region 120 via the second bit line (EN<1>) 32 may remain at 2.5V for the duration of the write logic low (e.g., binary "0" data state) operation. For example, a predetermined voltage potential applied to the N+ region 120 via the second bit line (EN<1>) 32 may remain at 2.5V in order to maintain the voltage potential at the P– region 122 at a lower voltage potential. In an exemplary embodiment, the P– region 122 may not be coupled to a higher voltage potential due a junction capacitance between the N+ region 120 and the P– region 122 caused by varying the voltage potential applied to the N+ region 120.

In another exemplary embodiment, a write logic low (e.g., binary "0" data state) operation may be performed to a first memory cell 12 corresponding to a first bit line (EN<0>) 32, while a write logic high (e.g., binary "1" data state) operation may be performed to a second memory cell 12 corresponding to a second bit line (EN<1>) 32. The write logic low (e.g., binary "0" data state) operation and the write logic high (e.g., binary "1" data state) may comprise similar predetermined voltage potentials (e.g., the word line (WL) 28, the source line (CN) 30, and/or the carrier injection line (EP) 34) as discussed above, except for the predetermined voltage potential applied to the bit line (EN) 32. For example, the predetermined voltage potential applied to the first bit line (EN<0>) 32 may remain at 2.5V in order to perform a write logic low (e.g., binary "0" data state) operation and the predetermined voltage potential applied to the second bit line (EN<1>) 32 may be lowered to 0V and subsequently raised back to 2.5V in order to perform a write logic high (e.g., binary "1" data state).

Further illustrated in FIG. 5, are exemplary voltage potentials at the P− region 122 corresponding to write operations performed on different columns of the memory cell array 20 when the carrier injection line (EP) 34 is biased high.

Figure 6:
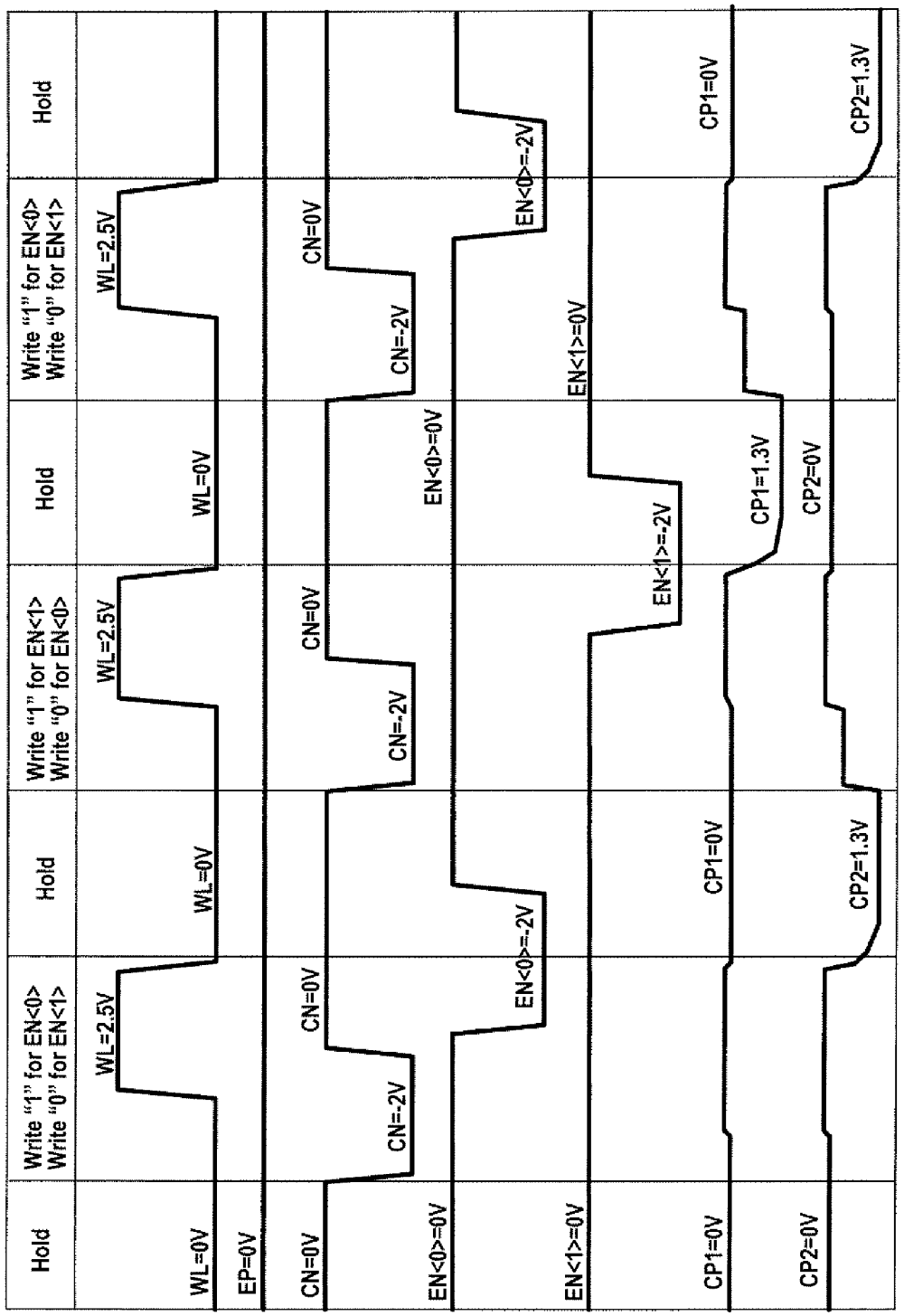
FIG. 6 shows control signal voltage waveforms for write operations performed on different columns of a memory cell array when the carrier injection line is biased low in accordance with an embodiment of the present disclosure.

Referring to FIG. 6, there are shown control signal voltage waveforms for write operations performed on different columns of a memory cell array when the carrier injection line is biased low in accordance with an embodiment of the present disclosure. For example, during one or more write operations, a predetermined voltage potential may be applied to the carrier injection line (EP) 34. For example, the predetermined voltage potential applied to the carrier injection line (EP) 34 may be high or low. In an exemplary embodiment, a low predetermined voltage potential may be applied to the carrier injection line (EP) 34, for example, 0V. Write operations may be performed to one or more memory cells 12 (e.g., corresponding to different bit lines (EN) 32) on a selected row (e.g., corresponding to different word lines (WL) 28, source lines (CN) 30, and/or carrier injection lines (EP) 34) of the memory cell array 20. For example, different write operations may be performed to different memory cells 12 on a selected row of the memory cell array 20. In an exemplary embodiment, a write logic high (e.g., binary "1" data state) operation may be performed to a first memory cell 12 (e.g., corresponding to first bit line (EN<0>) 32), while a write logic low (e.g., binary "0" data state) operation may be performed to a second memory cell 12 (e.g., corresponding to second bit line (EN<1>) 32) on a selected row of the memory cell array 20.

As illustrated in FIG. 6, a write logic high (e.g., binary "1" data state) operation may be performed to a first memory cell 12 corresponding to a first bit line (EN<0>) 32 and a write logic low (e.g., binary "0" data state) operation may be performed to a second memory cell 12 corresponding to a second bit line (EN<1>) 32 of a selected row of the memory cell array 20. During a write logic high (e.g., binary "1" data state) operation, a predetermined voltage potential applied to the N+ region 124 via a corresponding source line (CN) 30 may be lowered to −2.0V from 0V (e.g., holding voltage potential).

Also, a predetermined voltage potential applied to the N+ region 120 via the bit line (EN<0>) 32 may be lowered to −2.0V from 0V (e.g., holding voltage potential). In an exemplary embodiment, the predetermined voltage potential applied to the N+ region 124 and the predetermined voltage potential applied to the N+ region 120 may be lowered to −2.0V consecutively from 0V.

The lowered voltage potential applied to the N+ region 124 via the corresponding source line (CN) 30 may cause the junction between the N+ region 124 and the P+ region 126 to become forward biased and switch the second bipolar transistor 14*b* to an "ON" state. The majority charge carriers (e.g., holes) may be injected into the P− region 122 via the forward biased junction between the N+ region 124 and the P+ region 126 and a corresponding carrier injection line (EP) 34. An amount of majority charge carriers may be accumulated/stored in the P− region 122 to indicate that a logic high (e.g., binary "1" data state) is stored in the memory cell 12. In an exemplary embodiment, an amount of majority charge carriers accumulated/stored in the P− region 122 may be approximately −1.3V and/or until forward biasing the junction between the P− region 122 and the N+ region 124.

Thereafter, a predetermined voltage potential applied to the word line (WL) 28 may be adjusted, such that the voltage potential at the P− region 122 (e.g., by capacitively coupling to the word line (WL) 28)) may cause the junction between the P− region 122 and the N+ region 124 to become forward biased and deplete the P− region 122 of excessive majority charge carriers (e.g., holes). In an exemplary embodiment, a predetermined voltage potential applied to the word line (WL) 28 may be raised to approximately 2.5V from 0V (e.g., hold voltage potential). Subsequently, the predetermined voltage potential applied to the N+ region 124 via the source line (CN) 30 may be raised back to approximately 0V from −2.0V and the junction between the N+ region 124 and the P+ region 126 may become reverse biased and the second bipolar transistor 14*b* may be switched to an "OFF" state. The injection of the majority charge carriers may be stopped by reverse biasing the junction between the N+ region 124 and the P+ region 126. Subsequently, the predetermined voltage potential applied to the N+ region 120 via the bit line (EN<0>) 32 may be lowered to −2.0V from 0V in order to obtain a higher voltage potential at the P− region 122. At the end of a write logic high (e.g., binary "1" data state) operation, the predetermined voltage potential applied to the word line (WL) 28 may be lowered back to 0V from 2.5V in order to maintain the logic high (e.g., binary "1" data state) stored in the memory cell 12. Finally, the predetermined voltage potential applied to the N+ region 120 via the bit line (EN<0>) 32 may be raised back to 0V from −2.0V.

Also, illustrated in FIG. 6, a write logic low (e.g., binary "0" data state) operation may be performed to a second memory cell 12 corresponding to a second bit line (EN<1>) 32, while the write logic high (e.g., binary "1" data state) operation may be performed to the first memory cell 12 corresponding to the first bit line (EN<0>) 32 of a selected row of the memory cell array 20, as discussed above. The predetermined voltage potentials applied to the second memory cell 12 corresponding to the second bit line (EN<1>) 32 via the word line (WL) 28, the source line (CN) 30, the carrier injection line (EP) 34, may be similar to the predetermined voltage potentials applied to the first memory cell 12 corresponding to the first bit line (EN<0>) 32 except for a predetermined voltage potential applied to the N+ region 120 via the second bit line (EN<1>) 32.

In an exemplary embodiment, a predetermined voltage potential applied to the region 120 via the second bit line (EN<1>) 32 may remain at 0V for the duration of the write logic low (e.g., binary "0" data state) operation. For example, a predetermined voltage potential applied to the N+ region 120 via the second bit line (EN<1>) 32 may remain at 0V in order to maintain the voltage potential at the P− region 122 at a lower voltage potential. In an exemplary embodiment, the P− region 122 may not be coupled to a higher voltage potential due a junction capacitance between the N+ region 120 and the P− region 122 caused by varying the voltage potential applied to the region 120.

In another exemplary embodiment, a write logic low (e.g., binary "0" data state) operation may be performed to a first memory cell 12 corresponding to a first bit line (EN<0>) 32, while a write logic high (e.g., binary "1" data state) operation may be performed to a second memory cell 12 corresponding to a second bit line (EN<1>) 32. The write logic low (e.g., binary "0" data state) operation and the write logic high (e.g., binary "1" data state) may comprise similar predetermined voltage potentials (e.g., the word line (WL) 28, the source line (CN) 30, and/or the carrier injection line (EP) 34) as discussed above, except for the predetermined voltage potential applied to the bit line (EN) 32. For example, the predetermined voltage potential applied to the first bit line (EN<0>) 32 may remain at 0V in order to perform a write logic low (e.g., binary "0" data state) operation and the predetermined voltage potential applied to the second bit line (EN<1>) 32 may be lowered to −2.0V and subsequently raised back to 0V in order to perform a write logic high (e.g., binary "1" data state).

Further illustrated in FIG. 6, are exemplary voltage potentials at the P− region 122 corresponding to write operations performed on different columns of a memory cell array when the carrier injection line (EP) 34 is based low.

Figure 7:
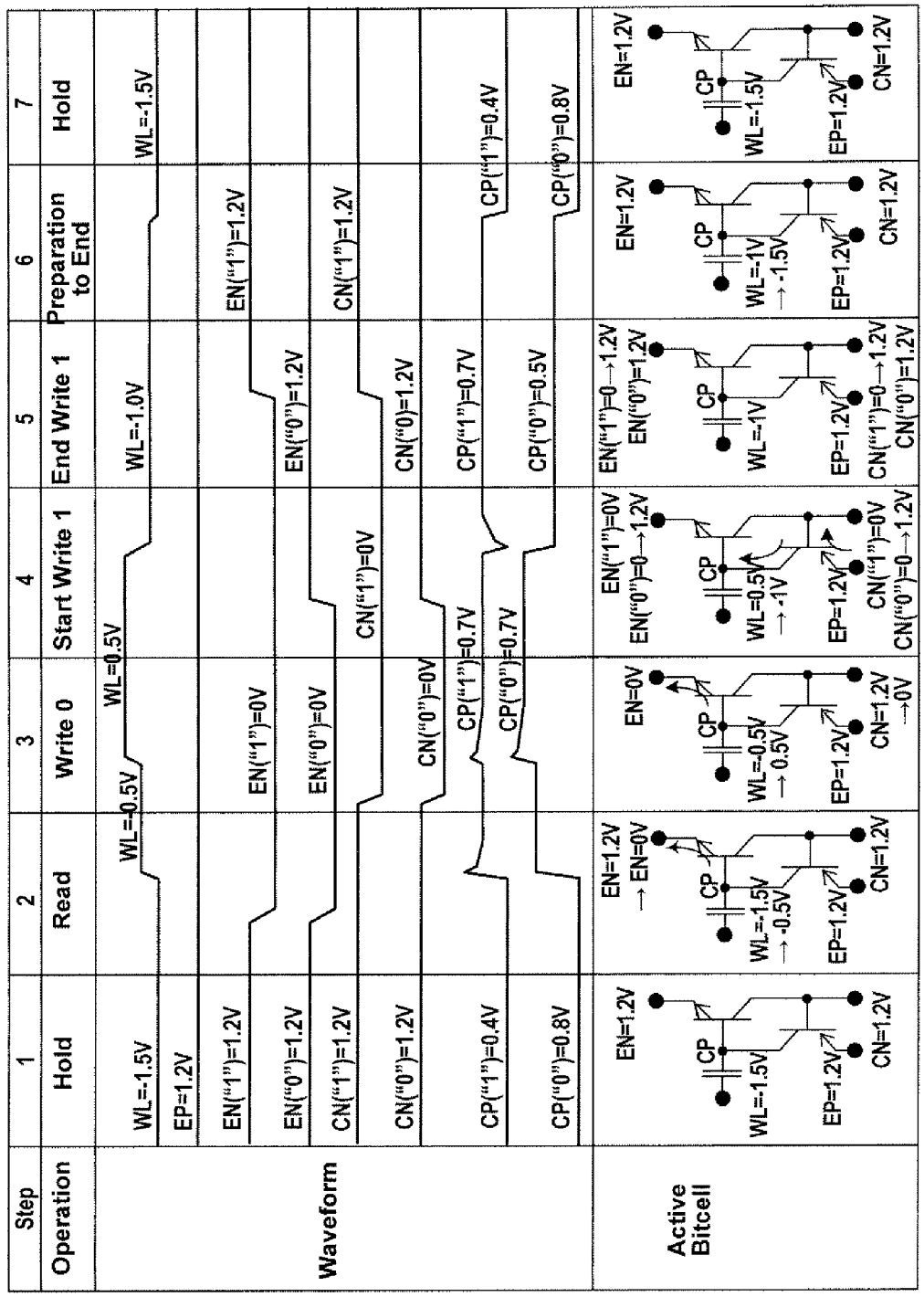
FIG. 7 shows control signal voltage waveforms for performing a refresh operation on a memory cell in accordance with an embodiment of the present disclosure.

Referring to FIG. 7, there are shown control signal voltage waveforms for performing a refresh operation on a memory cell in accordance with an embodiment of the present disclosure. For example, the refresh operation may include control signals configured to perform one or more operations. In an exemplary embodiment, the refresh operation may include a read operation, a write logic low (e.g., binary "0" data state) operation, a write logic high (e.g., binary "1" data state) operation, and/or preparation to end operation. Prior to performing a refresh operation, the control signals may be configured to perform a hold operation in order to maintain a data state (e.g., a logic high (binary "1" data state) or a logic low (binary "0" data state)) stored in the memory cell 12. In particular, the control signals may be configured to perform a hold operation in order to maximize a retention time of a data state (e.g., a logic low (binary "0" data state) and/or a logic high (binary "1" data state)) stored in the memory cell 12. Also, the control signals for the hold operation may be configured to eliminate or reduce activities or fields (e.g., electrical fields between junctions which may lead to leakage of charges) within the memory cell 12. In an exemplary embodiment, during a hold operation, a negative voltage potential may be applied to the word line (WL) 28 that may be capacitively coupled to the P− region 122 of the memory cell 12 while voltage potential applied to other regions (e.g., the N+ region 120, the N+ region 124, and/or the P+ region 126) may be maintained at approximately 1.2V. For example, the negative voltage potential applied to the word line (WL) 28 (e.g., capacitively coupled to the P− region 122 of the memory cell 12) may be −1.5V. During the hold operation, the junction between the N+ region 124 and the P− region 122 and the junction between the N+ region 120 and the P− region 122 may be reverse biased in order to retain a data state (e.g., a logic high (binary "1" data state) or a logic low (binary "0" data state)) stored in the memory cell 12.

In an exemplary embodiment, a refresh operation may include a read operation where the control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (EN) 32. In an exemplary embodiment, a voltage potential applied to the N+ region 120 via the bit line (EN) 32 may be lowered to a predetermined voltage potential. Subsequent to or simultaneous to lowering the voltage potential applied to the N+ region 120 via the bit line (EN) 32, a voltage potential applied to the word line (WL) 28 (e.g., capacitively coupled to the P− region 122) may be raised to a predetermined voltage potential. For example, the voltage potential applied to the N+ region 120 of the memory cell 12 may be lowered to 0V from 1.2V, while the voltage potential applied to the word line (WL) 28 (e.g., capacitively coupled to the P− region 122 of the memory cell 12) may be raised to −0.5V from −1.5V.

During a read operation, a voltage potential applied to the N+ region 120 via the bit line (EN) 32 may be lowered to 0V from 1.2V and subsequently or simultaneously, a voltage potential applied to the word line (WL) 28 (e.g., capacitively coupled to the P− region 122 of the memory cell 12) may be raised to −0.5V.

Under such biasing of the memory cell 12, when a logic high (e.g., binary "1" data state) is stored in the memory cell 12, the junction between the P− region 122 and the N+ region 120 may become forward biased. The voltage or current generated when forward biasing the junction between the P− region 122 and the N+ region 120 may be outputted to a data sense amplifier via the bit line (EN) 32 coupled to the N+ region 120. In another exemplary embodiment, when a logic low (e.g., binary "0" data state) is stored in the memory cell 12, the junction between the P− region 122 and the N+ region 120 may remain reverse biased or become weakly forward biased (e.g., above the reverse bias voltage and below forward bias threshold voltage). No voltage or current may be generated when the junction between the P− region 122 and the N+ region 120 is reverse biased or weakly forward biased and a data sense amplifier may detect no voltage or current via the bit line (EN) 32 coupled to the N+ region 120. The voltage potential applied during a read operation may not switch the second bipolar transistor 14b to an "ON" state. The second bipolar transistor 14b may remain in an "OFF" state during the read operation.

In other exemplary embodiments, a refresh operation may include a write logic low (e.g., binary "0" data state) operation where the control signals may be configured to perform one or more write operations to one or more selected memory cells 12 of one or more selected rows of the memory cell array 20. For example, the write logic low (e.g., binary "0" data state) operation may be performed on one or more selected rows of the memory cell array 20 or the entire memory cell array 20 and a subsequent write logic high (e.g., binary "1" data state) operation may be performed on one or more selected memory cells 12. For example, a voltage potential applied to the N+ region 124 via the source line (CN) 30 may be lowered to 0V from 1.2V. Subsequent to or simultaneously to lowering the voltage potential applied to the N+ region 124 via the source line (CN) 30, a voltage potential applied to the word line (WL) 28 may be adjusted, such that the voltage potential at the P− region 122 (e.g., by capacitively coupling to the word line (WL) 28) may be higher than a voltage potential applied to the source line (CN) and/or the bit line (EN) 32 by a predetermined voltage potential. The predetermined voltage potential may be a threshold voltage potential or forward bias voltage potential of the first bipolar transistor 14a and/or the second bipolar transistor 14b. For example, the predetermined voltage potential may be approximately 0.7V.

In an exemplary embodiment, a voltage potential applied to the N+ region 124 via the source line (CN) 30 may be lowered to 0V from 1.2V. Also, a voltage potential applied to the bit line (EN) 32 may remain the same as the voltage potential applied during the read operation (e.g., 0V). Power may be saved by eliminating switching or maintaining the voltage potential applied via the bit line (EN) 32 during the read operation and the write logic low (e.g., binary "0" data state). In an exemplary embodiment, when the voltage potential applied to the word line (WL) 28 (e.g., capacitively coupled to the P− region 122 of the memory cell 12) is raised to 0.5V, the voltage potential applied to the N+ region 124 via the source line (CN) 30 is maintained at 0V, the voltage potential applied to the N+ region 120 via the bit line (EN) 32 is maintained at 0V, and a logic high (e.g., binary "1" data state) is stored in the memory cell 12, the first bipolar transistor 14a (e.g., regions 120-124) may be switched to an "ON" state to remove majority charge carriers from the P− region 122 via the forward biased junction between the P− region 122 and the N+ region 120 and the junction between the P− region 122 and the N+ region 124. In another exemplary embodiment, when the voltage potential applied to the N+ region 124 via the source line (CN) 30, the voltage potential applied to the N+ region via the bit line (EN) 32 are maintained at 0V and a logic low (e.g., binary "0" data state) is stored in the memory cell 12, the junction between the N+ region 120 and the P− region 122 may not be forward biased and the junction between the P− region 122 and the N+ region 124 may not be forward biased, thus the logic low (e.g., binary "0" data state) may be maintained in the memory cell 12.

Also, when the voltage potential applied to the N+ region 124 via the source line (CN) 30 is lowered to 0V, the junction between N+ region 120 and the P− region 122 and the junction between the P− region 122 and the N+ region 124 may be forward biased and charges stored in the P− region 122 may be depleted via the N+ region 120 and/or the N+ region 124. In other exemplary embodiments, the write logic low (e.g., binary "0" data state) operation may be performed via the word line (WL) 28. For example, a voltage potential may be applied to the word line (WL) 28 to create a depletion region within the P− region 122. The voltage potential applied to the word line (WL) 28 may be sufficient to create a depletion region within the P− region 122 that may extend from N+ region 120 to N+ region 124 within the P− region 122. The depletion region within the P− region 122 may couple the N+ region 120, the P− region 122, and the N+ region 124 to each other and may create a single region including the N+ region 120, the P− region 122, and the N+ region 124. The charges stored in the P− region 122 may be depleted via the N+ region 120 and/or the N+ region 124.

In another exemplary embodiment, a refresh operation may include a write logic high (e.g., binary "1" data state) operation where the control signals may be configured to write a logic high (e.g., binary "1" data state) to the one or more selected memory cells 12. For example, a predetermined voltage potential may be applied to the word line (WL) 28 (e.g., capacitively coupled to the P− region 122), the N+ region 124 via the source line (CN) 30, the N+ region 120 via the bit line (EN) 32, and/or the P+ region via the carrier injection line (EP) 34. In an exemplary embodiment, in preparation to perform the write logic high (e.g., binary "1" data state) operation, the voltage potential applied to the N+ region 120 and/or the N+ region 124 of the one or more selected memory cells 12 may be maintained at 0V. The voltage potential applied to the word line (WL) 28 (e.g., capacitively coupled to the P− region 122) may be lowered to −1.0V.

Under such biasing, the P− region 122 may be positively charged via the forward biased junction between the N+ region 120 and the P− region 122 and the junction between the P− region 122 and the N+ region 124 so that a logic high (e.g., binary "1" data state) may be written to the P− region 122 (e.g., majority charge carrier injected into the P− region 122 from the P+ region 126). As more majority charge carriers are accumulated in the P− region 122, the voltage potential at the P− region 122 may increase to approximately 0.7V to 1.0V above the voltage potential at N+ region 124.

In order to maintain a logic low (e.g., binary "0" data state) in one or more unselected memory cells 12, a masking operation may be performed on the one or more selected memory cells 12. For example, the voltage potential applied to the N+ region 120 and/or the N+ region 124 of the one or more unselected memory cells 12 may be raised to 0.7V or higher (e.g., 1.2V) in order to prevent majority charge carrier injection into the P− region 122 from the P+ region 126 via the N+ region 124. Under such biasing, the junction between the N+ region 120 and the P− region 122 may not be forward biased and the junction between the P+ region 126 and the N+ region 124 may not be forward biased or weakly forward biased or become weakly forward biased (e.g., above the reverse bias voltage and below forward bias threshold voltage) to prevent the majority charge carrier flow and the logic low (e.g., binary "0" data state) may be maintained in the memory cell 12.

At the end of a write logic high (e.g., binary "1" data state) operation, the voltage potential applied to the N+ region 120 via the bit line (EN) 32 and/or the N+ region 124 via the source line (CN) 30 may be raised to a predetermined voltage potential in order to stop the majority chare carriers being injected into the P− region 122.

The refresh operation may also include a preparation to end operation. During the preparation to end operation, the voltage potentials applied to the memory cells 12 may adjust the amount of majority charge carriers or data state stored in the P− region 122 of the memory cells 12. As discussed above, the P− region 122 may be charged to approximately 0.7V above the voltage potential at the N+ region 124 during the write logic high (e.g., binary "1" data state) operation. The voltage potential applied to the word line (WL) 28 (e.g., capacitively coupled to the P− region 122) may be lowered to −1.5V and may determine an amount of majority charge carriers or data state stored in the P− region 122 of the memory cells 12. In an exemplary embodiment, the P− region 122 of the memory cell 12 may be charged to approximately 0.7V when the voltage potential applied on the word line (WL) 28 is −1.0V, however, when the voltage potential on the word line (WL) 28 is lowered to −1.5V (e.g., a holding voltage potential) the voltage potential at the P− region 122 may be lowered by some fraction of 0.5V due to the capacitive coupling of the voltage potential to the word line (WL) 28.

The voltage potential applied to the word line (WL) 28 during the write logic high (e.g., binary "1" data state) may be selected based on one or more factors. For example, the one or more factors may include a disturbance (e.g., disturbance may increase with an increase in the amount of charge stored in the P− region 122 of the memory cells 12), charge time (e.g., charge time may increase with an increase in the amount of charge stored in the P− region 122 of the memory cells 12), and retention time (e.g., retention time may decrease with a decrease in the amount of charge stored in the P− region 122 of the memory cells 12). Also, a voltage potential applied to the N+ region 120 via the bit line (EN) 32 and/or the N+ region 124 via the source line (CN) 30 may remain at 1.2V during the preparation to end operation in order to maintain the second bipolar transistor 14b in the "OFF" state. After the refresh operation, the voltage potentials applied to the memory cells 12 may be returned to the hold operation in order to retain a data state (e.g., logic low (binary "0" data state) or logic high (binary "1" data state)).

Further illustrated in FIG. 7, are exemplary voltage potentials at the P− region 122 corresponding to various operations during a refresh operation performed on the memory cell 12.

Figure 8:
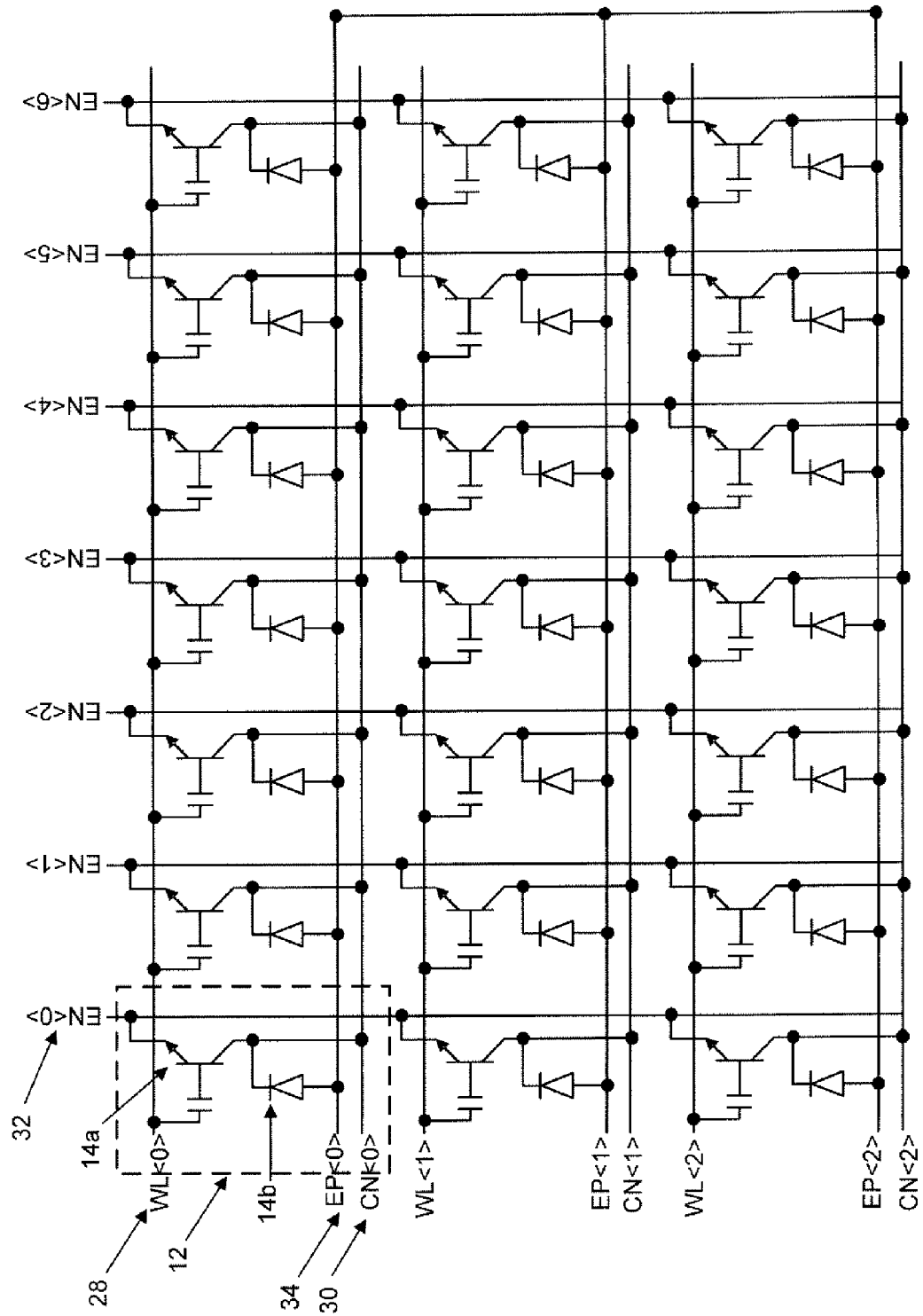
FIG. 8 shows a schematic diagram of at least a portion of the memory cell array having a plurality of memory cells in accordance with a first alternative embodiment of the present disclosure.

Referring to FIG. 8, there is shown a schematic diagram of at least a portion of the memory cell array 20 having the plurality of memory cells 12 in accordance with a first alternative embodiment of the present disclosure. For example, the memory cell array 20 shown in FIG. 8 may be implemented with the structure and techniques similar to that of the memory cell array 20 shown in FIG. 2, except that each of the memory cells 12 may comprise a bipolar transistor 14a and a diode 14b coupled to each other. For example, the bipolar transistor 14a may be an NPN bipolar transistor or an PNP bipolar transistor and the diode 14b may be a PN junction diode. In an exemplary embodiment, the bipolar transistor 14a may be an NPN bipolar transistor. As discussed above, each memory cell 12 may be coupled to a respective word line (WL) 28, a respective source line (CN) 30, a respective bit line (EN) 32, and a respective carrier injection line (EP) 34.

In an exemplary embodiment, the bipolar transistor 14a and the diode 14b may share one or more common regions. The NPN bipolar transistor 14a may comprise an N+ emitter region 120, a P− base region 122, and an N+collector region 124. The diode 14b may comprise the N+ region 124 and a P+ region 126. The N+ region 120, the P− region 122, the N+ region 124, and/or the P+ region 126 may be disposed in sequential contiguous relationship within a pillar or fin configuration that may extend vertically from and/or perpendicularly to a plane defined by an N-well region 128 and/or an P− substrate 130. In an exemplary embodiment, the P− region 122 may be an electrically floating body region of the memory cell 12 configured to accumulate/store charges, and may be spaced apart from and capacitively coupled to the word line (WL) 28.

Figure 9:
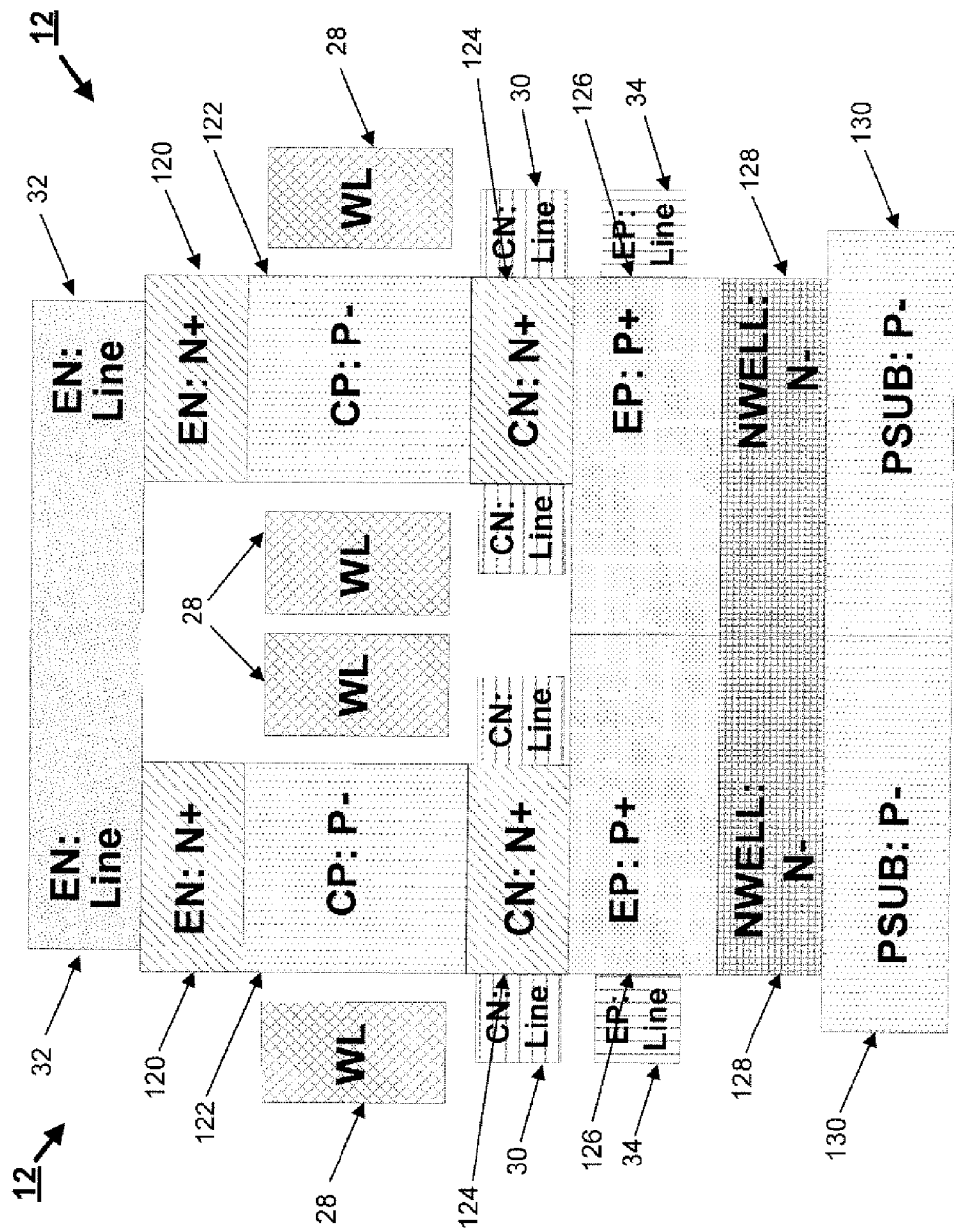
FIG. 9 shows a cross-sectional view of two memory cells along a column direction of a memory cell array in accordance with a first alternative embodiment of the present disclosure.

Referring to FIG. 9, there is shown a cross-sectional view of two memory cells 12 along a column direction of the memory cell array 20 shown in FIG. 8 in accordance with a first alternative embodiment of the present disclosure. As discussed above with respect to FIG. 8, each of the memory cells 12 may comprise a bipolar transistor 14a and a PN junction diode 14b coupled to each other. For example, the bipolar transistor 14a may be an NPN bipolar transistor or an PNP bipolar transistor. As illustrated in FIG. 9, the bipolar transistor 14a may be an NPN bipolar transistor and may share a common region (e.g., N-region) with the PN junction diode 14b. In another exemplary embodiment, the memory transistor 14a may be an PNP bipolar transistor and may share a common region (e.g., P-region) with the PN junction diode 14b.

Figure 10:
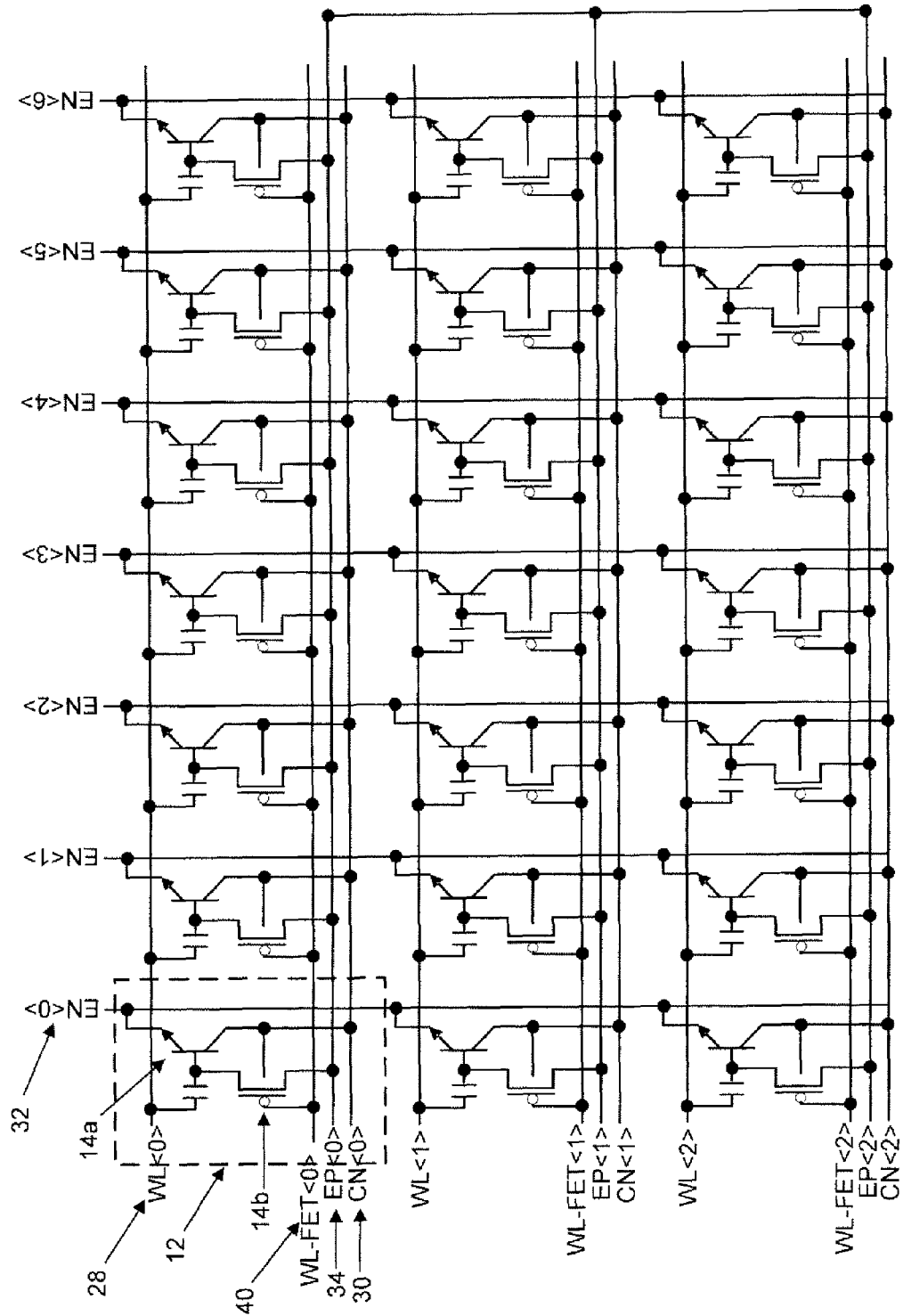
FIG. 10 shows a schematic diagram of at least a portion of the memory cell array having a plurality of memory cells in accordance with a second alternative embodiment of the present disclosure.

Referring to FIG. 10, there is shown a schematic diagram of at least a portion of the memory cell array 20 having the plurality of memory cells 12 in accordance with a second alternative embodiment of the present disclosure. For example, the memory cell array 20 shown in FIG. 10 may be implemented with the structure and techniques similar to that of the memory cell array 20 shown in FIG. 2, except that each of the memory cells 12 may comprise a bipolar transistor 14a and a metal-oxide-semiconductor field-effect transistor (MOSFET) 14b coupled to each other. For example, the bipolar transistor 14a may be an NPN bipolar transistor or an PNP bipolar transistor. The metal-oxide-semiconductor field-effect transistor (MOSFET) 14b may be a N-type metal-oxide-semiconductor field-effect transistor (MOSFET) or a P-type metal-oxide-semiconductor field-effect transistor (MOSFET).

As illustrated in FIG. 10, the bipolar transistor 14a may be an NPN bipolar transistor and the metal-oxide-semiconductor field-effect transistor (MOSFET) 14b may be an P-type metal-oxide-semiconductor field-effect transistor (MOSFET). Each memory cell 12 may be coupled to a respective word line (WL) 28, a respective source line (CN) 30, a respective bit line (EN) 32, a respective carrier injection line (EP) 34, and a respective field-effect transistor (FET) word line (WL-FET) 40. Data may be written to or read from a selected memory cell 12 by applying suitable control signals to a selected word line (WL) 28, a selected source line (CN) 30, a selected bit line (EN) 32, a selected carrier injection line (EP) 34, and/or a field-effect transistor (FET) word line (WL-FET) 40. In an exemplary embodiment, each word line (WL) 28, each source line (CN) 30, each carrier injection line (EP) 34, and each field-effect transistor (FET) word line (WL-FET) 40 may extend horizontally parallel to each other in a row direction. Each bit line (EN) 32 may extend vertically in a column direction perpendicular to each word line (WL) 28, source line (CN) 30, carrier injection line (EP) 34, and/or field-effect transistor (FET) word line (WL-FET) 40.

A data state may be read from one or more selected memory cells 12 by applied one or more control signals. A voltage and/or a current may be generated by the one or more selected memory cells 12 and outputted to the data write and sense circuitry 36 via a corresponding bit line (EN) 32 in order to read a data state stored in each selected memory cell 12. Also, a data state may be written to one or more selected memory cells by applying one or more control signals to one or more selected memory cells 12 via a selected word line (WL) 28, a selected source line (CN) 30, a selected bit line (EN) 32, a selected carrier injection line (EP) 34, and/or a selected field-effect transistor (FET) word line (WL-FET) 40. The one or more control signals applied to one or more selected memory cells 12 via a selected word line (WL) 28, a selected source line (CN) 30, a selected bit line (EN) 32, a selected carrier injection line (EP) 34, and/or a selected field-effect transistor (FET) word line (WL-FET) 40 may control each selected memory cell 12 in order to write a desired data state to each selected memory cell 12.

Figure 11:
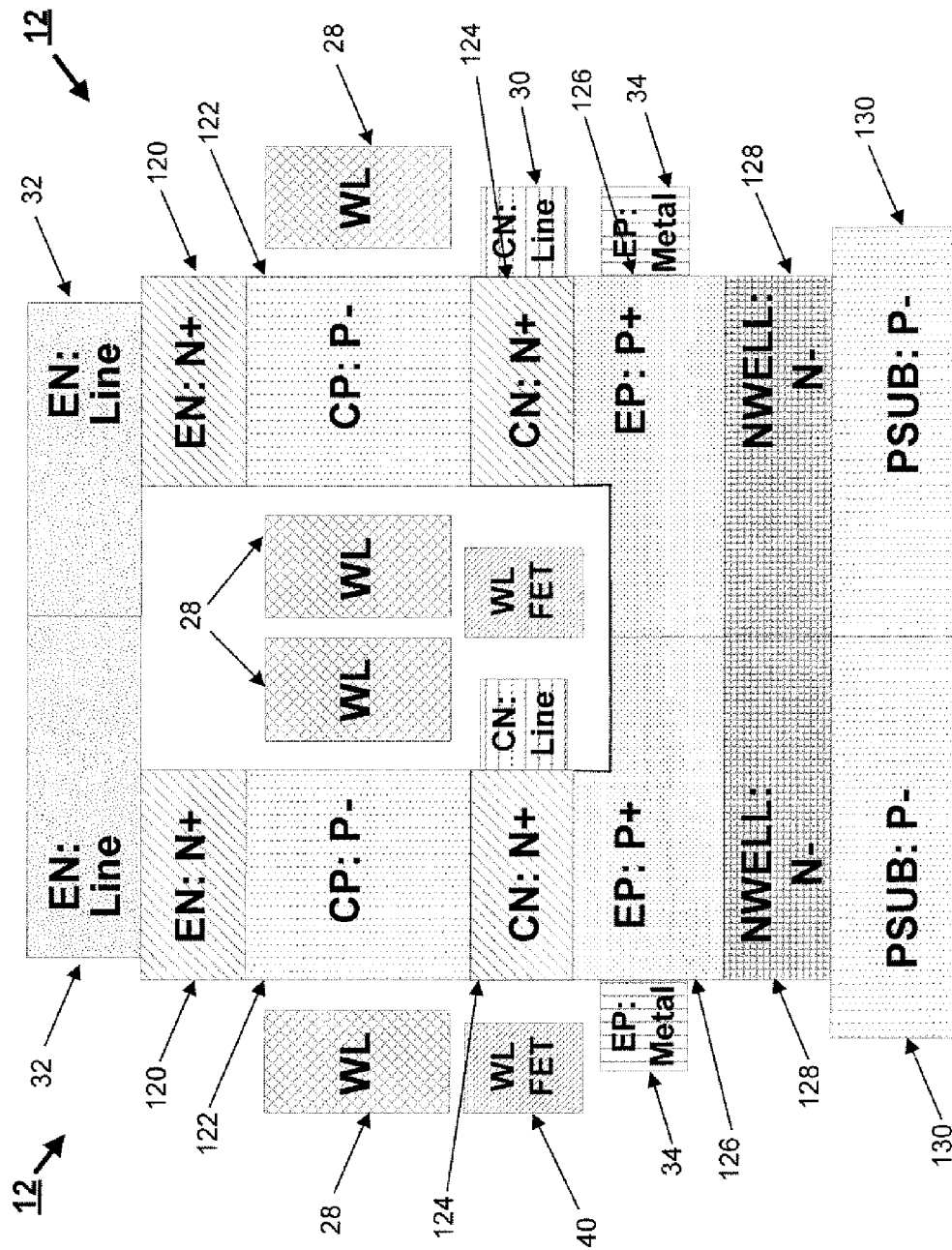
FIG. 11 shows a cross-sectional view of two memory cells along a column direction of a memory cell array in accordance with a second alternative embodiment of the present disclosure.

Referring to FIG. 11, there is shown a cross-sectional view of two memory cells 12 along a column direction of the memory cell array 20 shown in FIG. 10 in accordance with an embodiment of the present disclosure. As discussed above, each memory cell 12 may comprise a bipolar transistor 14a and a metal-oxide-semiconductor field-effect transistor (MOSFET) 14b. In an exemplary embodiment, the first bipolar transistor 14a may be a NPN bipolar transistor and the metal-oxide-semiconductor field-effect transistor (MOSFET) 14b may be a P-type metal-oxide-semiconductor field-effect transistor (MOSFET). In an exemplary embodiment, the bipolar transistor 14a and the metal-oxide-semiconductor field-effect transistor (MOSFET) 14b may share one or more common regions. The NPN bipolar transistor 14a may comprise an N+ emitter region 120, a P− base region 122, and an N+ collector region 124. The P-type metal-oxide-semiconductor field-effect transistor (MOSFET) 14b may comprise the P− drain region 122, the N+ gate region 124, and an P+ source region 126. The N+ region 120, the P− region 122, the N+ region 124, and/or the P+ region 126 may be disposed in sequential contiguous relationship within a pillar or fin configuration that may extend vertically to a plane defined by an N-well region 128 and/or an P− substrate 130. In an exemplary embodiment, the P− region 122 may be an electrically floating body region of the memory cell 12 configured to accumulate/store charges, and may be spaced apart from and capacitively coupled to the word line (WL) 28.

As shown in FIG. 11, the N+ region 124 of the memory cell 12 may be coupled to a source line (CN) 30. In an exemplary embodiment, the source line (CN) 30 may be configured on a side of the N+ region 124 of the memory cell 12. In another exemplary embodiment, the field-effect transistor (FET) word line (WL-FET) 40 may be capacitively coupled to the N+ region 124. The source line (CN) 30 may be disposed between the N+ region 124 and the field-effect transistor (FET) word line (WL-FET) 40. For example, the field-effect transistor (FET) word line (WL-FET) 40 may circumferentially surround the N+ region 124. The field-effect transistor (FET) word line (WL-FET)) 40 may be formed of a polycide layer or a metal layer extending in a row direction of the memory cell array 20. The field-effect transistor (FET) word line (WL-FET) 40 may extend horizontally in parallel to the word line (WL) 28, the source line (CN) 30, and/or the carrier injection line (EP) 34, and may be coupled to a plurality of memory cells 12 (e.g., a row of memory cells 12). For example, the field-effect transistor (FET) word line (WL-FET) 40 and the word line (WL) 28 and/or the carrier injection line (EP) 34 may be arranged in different planes and configured to be parallel to each other. The field-effect transistor (FET) word line (WL-FET) 40 may be arranged in a same plane as the source line (CN) 30. In an exemplary embodiment, the field-effect transistor (FET) word line (WL-FET) 40 may be arranged in a plane between a plane containing the word line (WL) 28 and a plane containing the carrier injection line (EP) 34.

Figure 12:
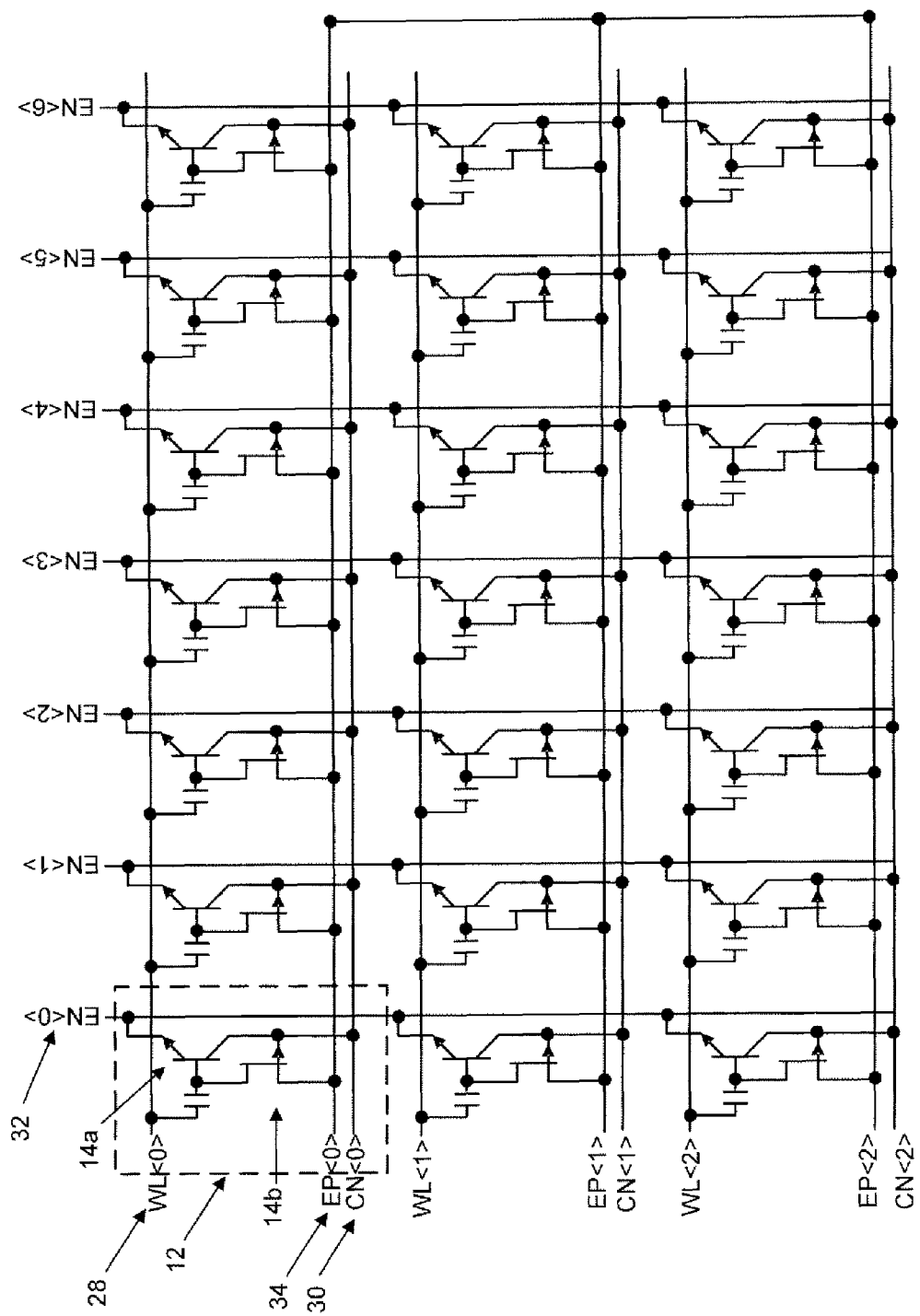
FIG. 12 shows a schematic diagram of at least a portion of the memory cell array having a plurality of memory cells in accordance with a third alternative embodiment of the present disclosure.

Referring to FIG. 12, there is shown a schematic diagram of at least a portion of the memory cell array 20 having the plurality of memory cells 12 in accordance with a third alternative embodiment of the present disclosure. For example, the memory cell array 20 shown in FIG. 12 may be implemented with the structure and techniques similar to that of the memory cell array 20 shown in FIG. 2, except that each of the memory cells 12 may comprise a bipolar transistor 14*a* and a junction gate field-effect transistor (JFET) 14*b* coupled to each other. For example, the bipolar transistor 14*a* may be an NPN bipolar transistor or an PNP bipolar transistor. The junction gate field-effect transistor (JFET) 14*b* may be a N-channel junction gate field-effect transistor (JFET) or a P-channel junction gate field-effect transistor (JFET). As illustrated in FIG. 12, the bipolar transistor 14*a* may be an NPN bipolar transistor and the junction gate field-effect transistor (JFET) 14*b* may be a P-channel junction gate field-effect transistor (JFET). In another exemplary embodiment, the bipolar transistor 14*a* may be an PNP bipolar transistor and the junction gate field-effect transistor 14*b* may be a N-channel junction gate field-effect transistor (JFET).

Each memory cell 12 may be coupled to a respective word line (WL) 28, a respective source line (CN) 30, a respective bit line (EN) 32, and a respective carrier injection line (EP) 34. Data may be written to or read from a selected memory cell 12 by applying suitable control signals to a selected word line (WL) 28, a selected source line (CN) 30, a selected bit line (EN) 32, and/or a selected carrier injection line (EP) 34. In an exemplary embodiment, each word line (WL) 28, each source line (CN) 30, and carrier injection line (EP) 34 may extend horizontally parallel to each other in a row direction. Each bit line (EN) 32 may extend vertically in a column direction perpendicular to each word line (WL) 28, source line (CN) 30, and/or carrier injection line (EP) 34.

Figure 13:
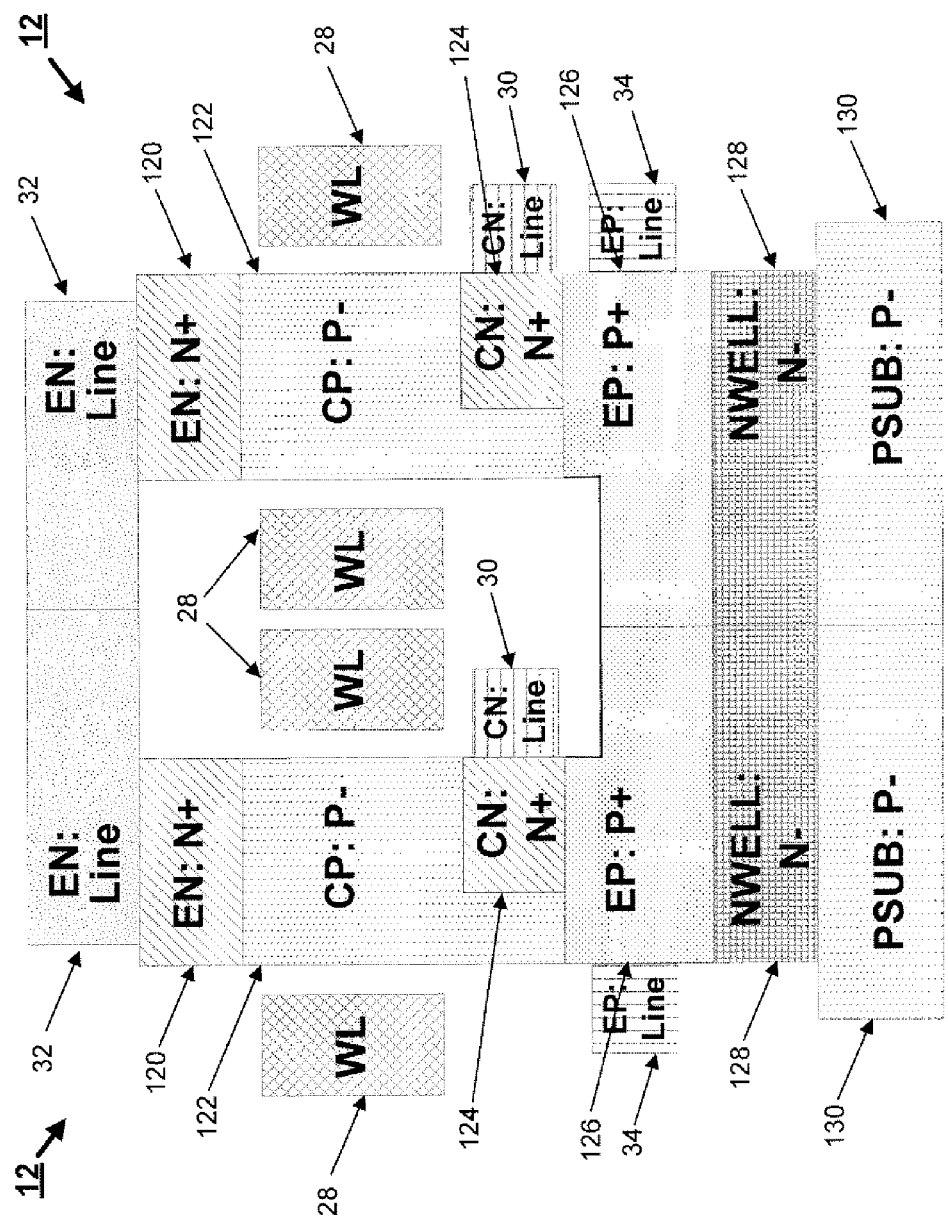
FIG. 13 shows a cross-sectional view of two memory cells along a column direction of a memory cell array in accordance with a third alternative embodiment of the present disclosure.

Referring to FIG. 13, there is shown a cross-sectional view of two memory cells 12 along a column direction of the memory cell array 20 shown in FIG. 12 in accordance with a third alternative embodiment of the present disclosure. As discussed above, each memory cell 12 may comprise a bipolar transistor 14*a* and a junction gate field-effect transistor (JFET) 14*b*. In an exemplary embodiment, the bipolar transistor 14*a* may be a NPN bipolar transistor and the junction gate field-effect transistor (JFET) 14*b* may be a P-channel junction gate field-effect transistor (JFET). In an exemplary embodiment, the bipolar transistor 14*a* and the junction gate field-effect transistor 14*b* may share one or more common regions. The NPN bipolar transistor 14*a* may comprise an N+ emitter region 120, a P− base region 122, and an N+collector region 124. The P-channel junction gate field-effect transistor 14*b* may comprise the P− drain region 122, the N+ gate region 124, and an P+ source region 126. The N+ region 120, the P− region 122, the N+ region 124, and/or the P+ region 126 may be disposed in sequential contiguous relationship within a pillar or fin configuration that may extend vertically to a plane defined by an N-well region 128 and/or an P− substrate 130. In an exemplary embodiment, the P− region 122 may be an electrically floating body region of the memory cell 12 configured to accumulate/store charges, and may be spaced apart from and capacitively coupled to the word line (WL) 28.

As also shown in FIG. 13, the P− region 122 may be capacitively coupled to a corresponding word line (WL) 28. In an exemplary embodiment, at least a portion of the P− region 122 may be directly coupled with the P+ region 126. In another exemplary embodiment, the N+ region 124 may be disposed between a portion of the P− region 122 and the P+ region 126. In other exemplary embodiments, the P− region 122 may be arranged to cover one or more side portions of the N+ region 124. As further shown in FIG. 3, the N+ region 124 of the memory cell 12 may be coupled to a source line (CN) 30. The source line (CN) 30 may be directly connected to a portion of the N+ region 124 of the memory cell 12.

At this point it should be noted that providing a direct injection semiconductor memory device having ganged carrier injection lines in accordance with the present disclosure as described above typically involves the processing of input data and the generation of output data to some extent. This input data processing and output data generation may be implemented in hardware or software. For example, specific electronic components may be employed in a direct injection semiconductor memory device or similar or related circuitry for implementing the functions associated with providing a direct injection semiconductor memory device having ganged carrier injection lines in accordance with the present disclosure as described above. Alternatively, one or more processors operating in accordance with instructions may implement the functions associated with providing a direct injection semiconductor memory device having ganged carrier injection lines in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A direct injection semiconductor memory device comprising:
   a first region coupled to a bit line;
   a second region coupled to a source line;
   a body region spaced apart from and capacitively coupled to a word line, wherein the body region is electrically floating and disposed between the first region and the second region; and
   a third region coupled to a constant voltage source via a carrier injection line configured to inject charges into the body region through the second region;

wherein the third region, the second region, the body region, and the first region are disposed in a sequential contiguous configuration extending substantially vertically from a horizontal plane defined by at least a substrate.

2. The direct injection semiconductor memory device according to claim 1, wherein the first region, the body region, and the second region forms a first bipolar transistor.

3. The direct injection semiconductor memory device according to claim 2, wherein the body region, the second region, and the third region forms a second bipolar transistor.

4. The direct injection semiconductor memory device according to claim 1, wherein the carrier injection line contacts the third region.

5. The direct injection semiconductor memory device according to claim 1, wherein the constant voltage source applies a positive bias to the third region via the carrier injection line.

6. The direct injection semiconductor memory device according to claim 1, wherein the constant voltage source applies 0V or a negative bias to the third region via the carrier injection line.

7. The direct injection semiconductor memory device according to claim 1, wherein the constant voltage source is coupled to a plurality of the carrier injection lines.

8. The direct injection semiconductor memory device according to claim 1, wherein the bit line extends from the first region perpendicular to at least one of the source line, the word line, and the carrier injection line.

9. The direct injection semiconductor memory device according to claim 1, wherein the word line extends from near the body region horizontally parallel to the carrier injection line.

10. The direct injection semiconductor memory device according to claim 1, wherein the source line extends from the second region horizontally parallel to at least one of the word line and the carrier injection line.

11. The direct injection semiconductor memory device according to claim 1, further comprising a fourth region disposed between the third region and the substrate.

12. The direct injection semiconductor memory device according to claim 11, wherein the fourth region is N-doped region and the substrate is a P-type substrate.

13. The direct injection semiconductor memory device according to claim 1, wherein the first region and the second region are N-doped regions.

14. The direct injection semiconductor memory device according to claim 1, wherein the body region and the third region are P-doped regions.

15. A method for providing a direct injection semiconductor memory device comprising the steps of:
coupling a first region to a bit line;
coupling a second region to a source line;
coupling a body region spaced apart from and capacitively to a word line, wherein the body region is electrically floating and disposed between the first region and the second region; and
coupling a third region to a constant voltage source via a carrier injection line configured to inject charges into the body region through the second region;
wherein the third region, the second region, the body region, and the first region are disposed in a sequential contiguous configuration extending substantially vertically from a horizontal plane defined by at least a substrate.

16. The method according to claim 15, wherein the constant voltage source applies a positive bias to the third region via the carrier injection line.

17. The method according to claim 15, wherein the constant voltage source applies 0V or a negative bias to the third region via the carrier injection line.

18. The method according to claim 15, wherein the constant voltage source is coupled to a plurality of the carrier injection lines.

19. The method according to claim 15, wherein the bit line extends from the first region perpendicular to at least one of the source line, the word line, and the carrier injection line.

20. The method according to claim 15, wherein the word line extends from near the body region horizontally parallel to the carrier injection line.

21. The method according to claim 15, wherein the source line extends from the second region horizontally parallel to at least one of the word line and the carrier injection line.

22. The method according to claim 15, further comprising a fourth region disposed between the third region and the substrate.

23. The method according to claim 22, wherein the fourth region is N-doped region and the substrate is a P-type substrate.

24. The method according to claim 15, wherein the first region and the second region are N-doped regions.

25. The method according to claim 15, wherein the body region and the third region are P-doped regions.

26. A direct injection semiconductor memory device comprising:
a first region coupled to a bit line;
a second region directly coupled to a source line and capacitively coupled to a first word line;
a body region spaced apart from and capacitively coupled to a second word line, wherein the body region is electrically floating and disposed between the first region and the second region; and
a third region coupled to a carrier injection line;
wherein the first word line provides control signals to a field-effect transistor comprising the third region, the second region, and the body region, and wherein the second word line provides control signals to a bipolar transistor comprising the second region, the body region, and the first region.

27. A direct injection semiconductor memory device comprising:
a first region coupled to a bit line;
a second region coupled to a source line;
a body region spaced apart from and capacitively coupled to a word line, wherein the body region is electrically floating and substantially disposed between the first region and the second region; and
a third region coupled to a carrier injection line, wherein a first portion of the third region is directly coupled to the second region and a second portion of the third region is directly coupled to the body region.

* * * * *